US012684717B2

(12) United States Patent (10) Patent No.: US 12,684,717 B2
Ahn et al. (45) Date of Patent: Jul. 14, 2026

(54) DISPLAY DEVICE WITH BASKET ATTACHED TO REAR COVER

(71) Applicant: LG ELECTRONICS INC., Seoul (KR)

(72) Inventors: Kwanghyun Ahn, Seoul (KR); Haesuk Choi, Seoul (KR); Dongkyoon Han, Seoul (KR); Jihoon Yoon, Seoul (KR); Seokwoo Kwon, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 18/288,762

(22) PCT Filed: Mar. 31, 2022

(86) PCT No.: PCT/KR2022/004647
§ 371 (c)(1),
(2) Date: Oct. 27, 2023

(87) PCT Pub. No.: WO2023/191147
PCT Pub. Date: Oct. 5, 2023

(65) Prior Publication Data
US 2024/0215184 A1 Jun. 27, 2024

(51) Int. Cl.
*H05K 5/02* (2006.01)
(52) U.S. Cl.
CPC .................................. *H05K 5/0234* (2013.01)
(58) Field of Classification Search
None
See application file for complete search history.

(56) References Cited

U.S. PATENT DOCUMENTS

| | | | | |
|---|---|---|---|---|
| 7,681,856 | B1 * | 3/2010 | Thomas | A47B 21/045 |
| | | | | 248/447 |
| 10,429,884 | B1 * | 10/2019 | Brittingham | G06F 1/1611 |
| 10,871,801 | B2 * | 12/2020 | Yao | G06F 1/3234 |
| 12,085,221 | B2 * | 9/2024 | Kim | F16M 11/2014 |
| 2008/0103637 | A1 * | 5/2008 | Bliven | F16B 2/20 |
| | | | | 701/1 |
| 2011/0116218 | A1 * | 5/2011 | Choi | G06F 1/1605 |
| | | | | 361/679.01 |
| 2012/0037771 | A1 * | 2/2012 | Kitchen | G06F 1/1632 |
| | | | | 248/223.41 |
| 2018/0008044 | A1 * | 1/2018 | Holt | G06F 1/1605 |

FOREIGN PATENT DOCUMENTS

| | | |
|---|---|---|
| JP | 2004-153410 A | 5/2004 |
| JP | 2009-522040 A | 6/2009 |
| KR | 10-2012-0083091 A | 7/2012 |
| KR | 10-2017-0084470 A | 7/2017 |

* cited by examiner

*Primary Examiner* — Allen L Parker
*Assistant Examiner* — Christopher L Augustin
(74) *Attorney, Agent, or Firm* — Birch, Stewart, Kolasch & Birch, LLP

(57) ABSTRACT

The display device includes: a display panel; a frame which is located in a rear of the display panel, and to which the display panel is coupled; a back cover which covers a rear of the frame, and which is coupled to the frame; and a basket which is located in a rear of the back cover, and which has an inner space. An upper side of the back cover is spaced apart from an upper side of the frame in a rearward direction, and the basket spans the upper side of the back cover.

20 Claims, 28 Drawing Sheets

[FIG. 1]
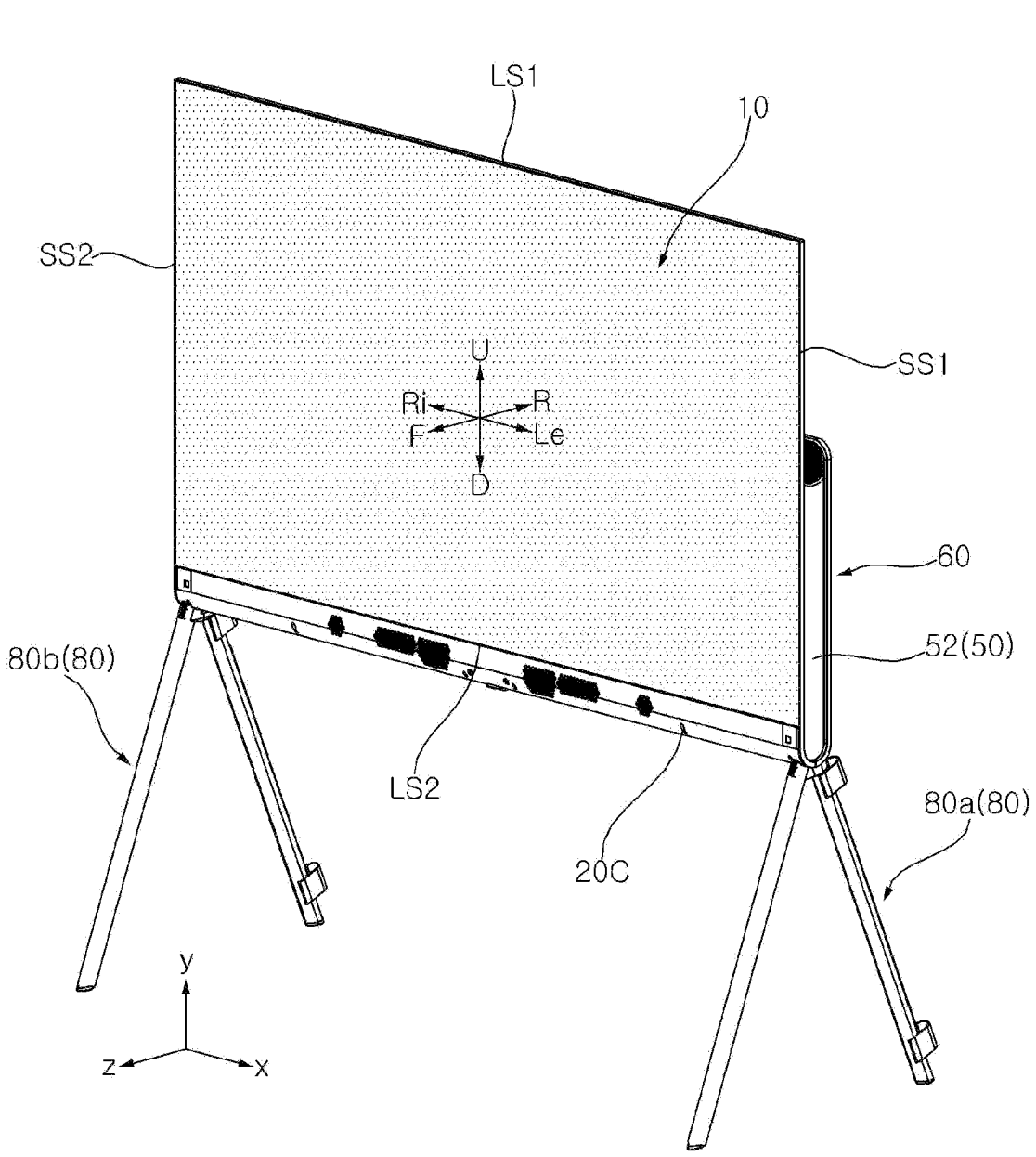

[FIG. 2]
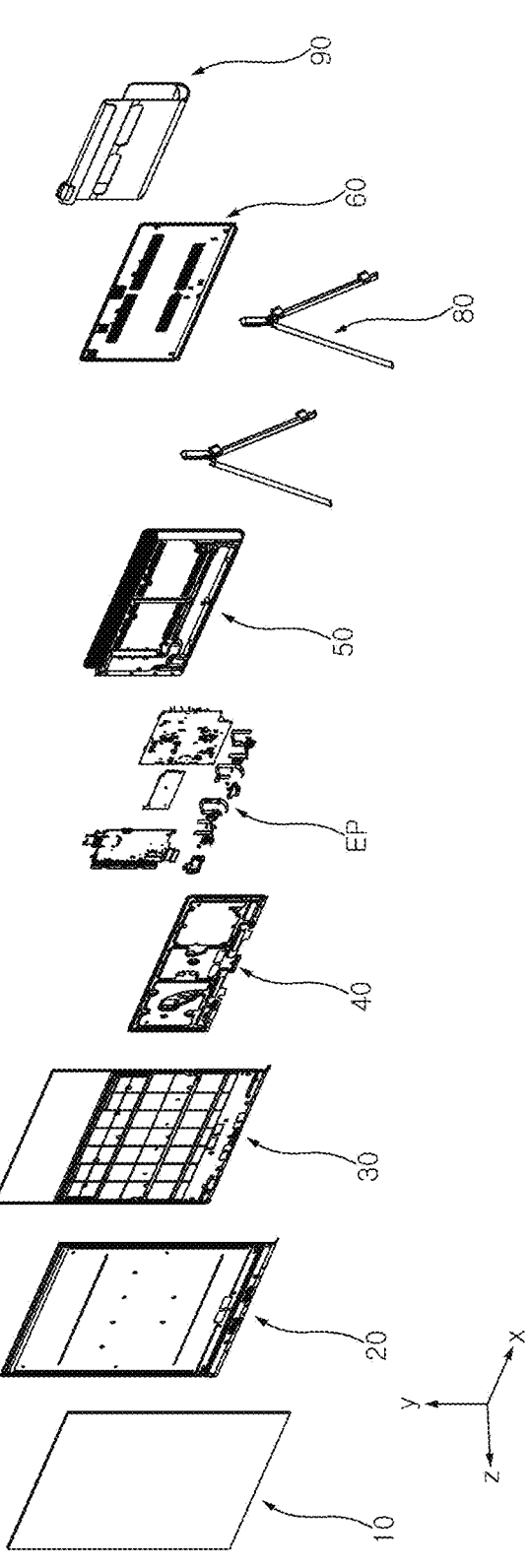

[FIG. 3]
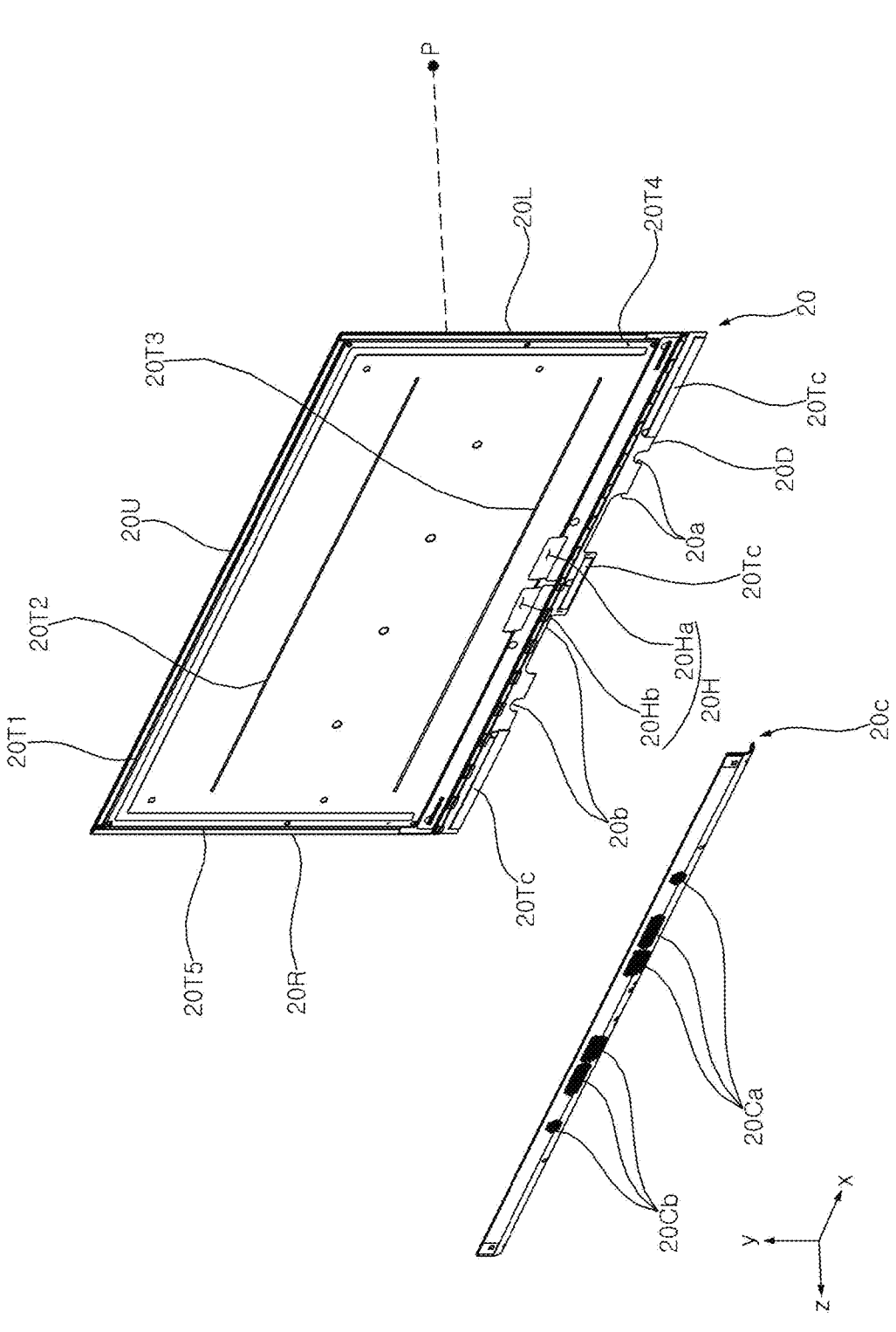

[FIG. 4]
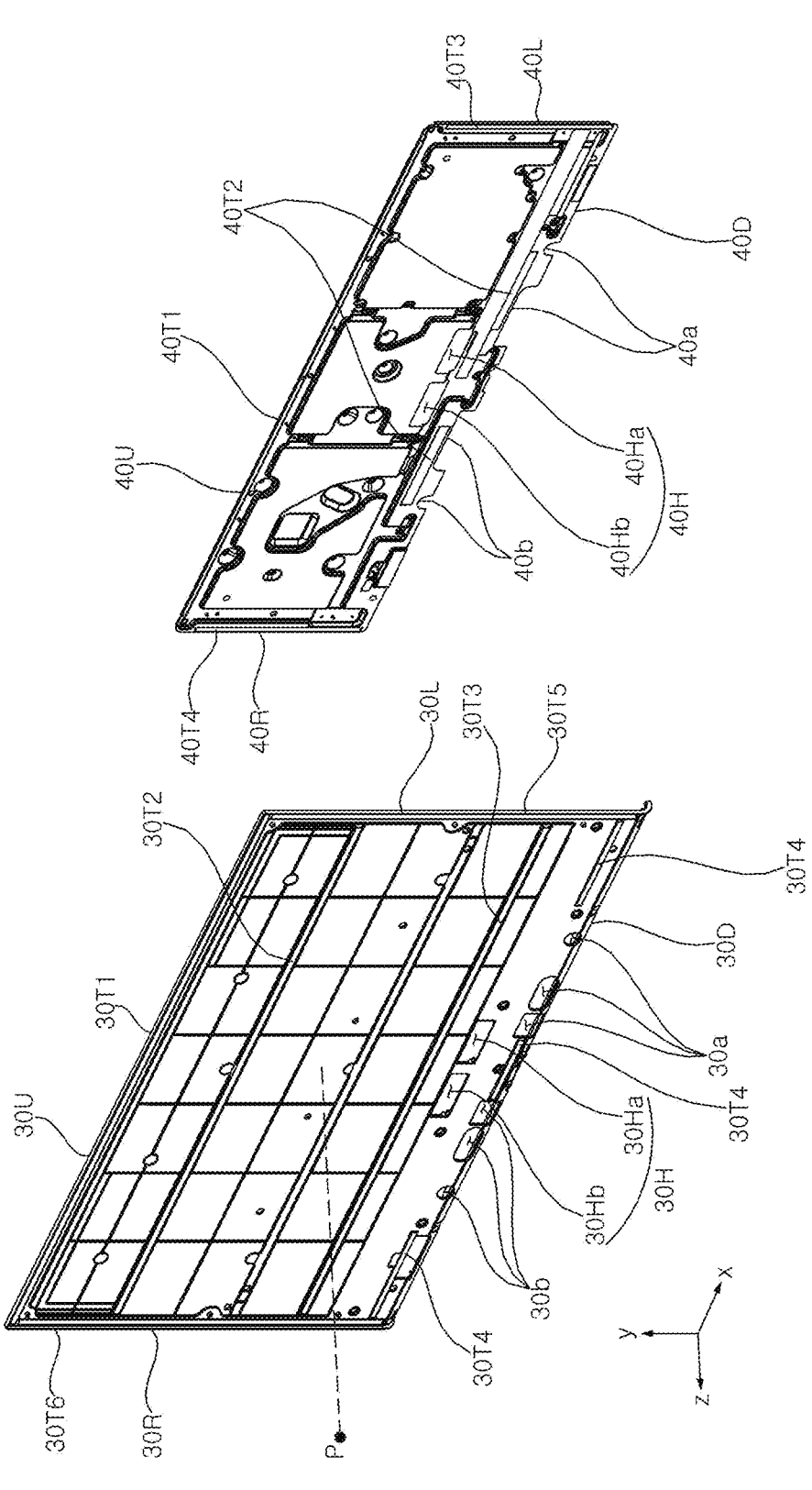

[FIG. 5]
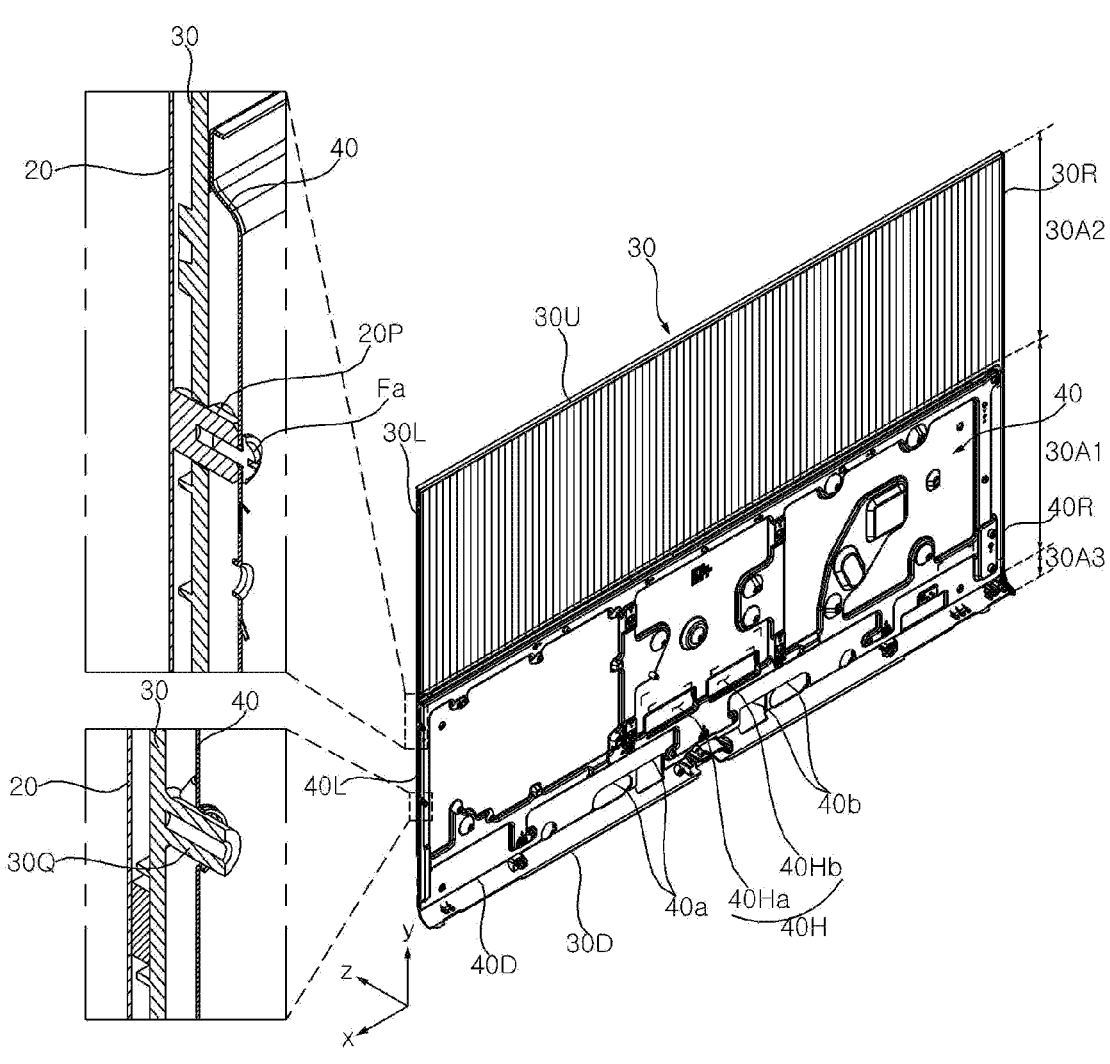

[FIG. 6]
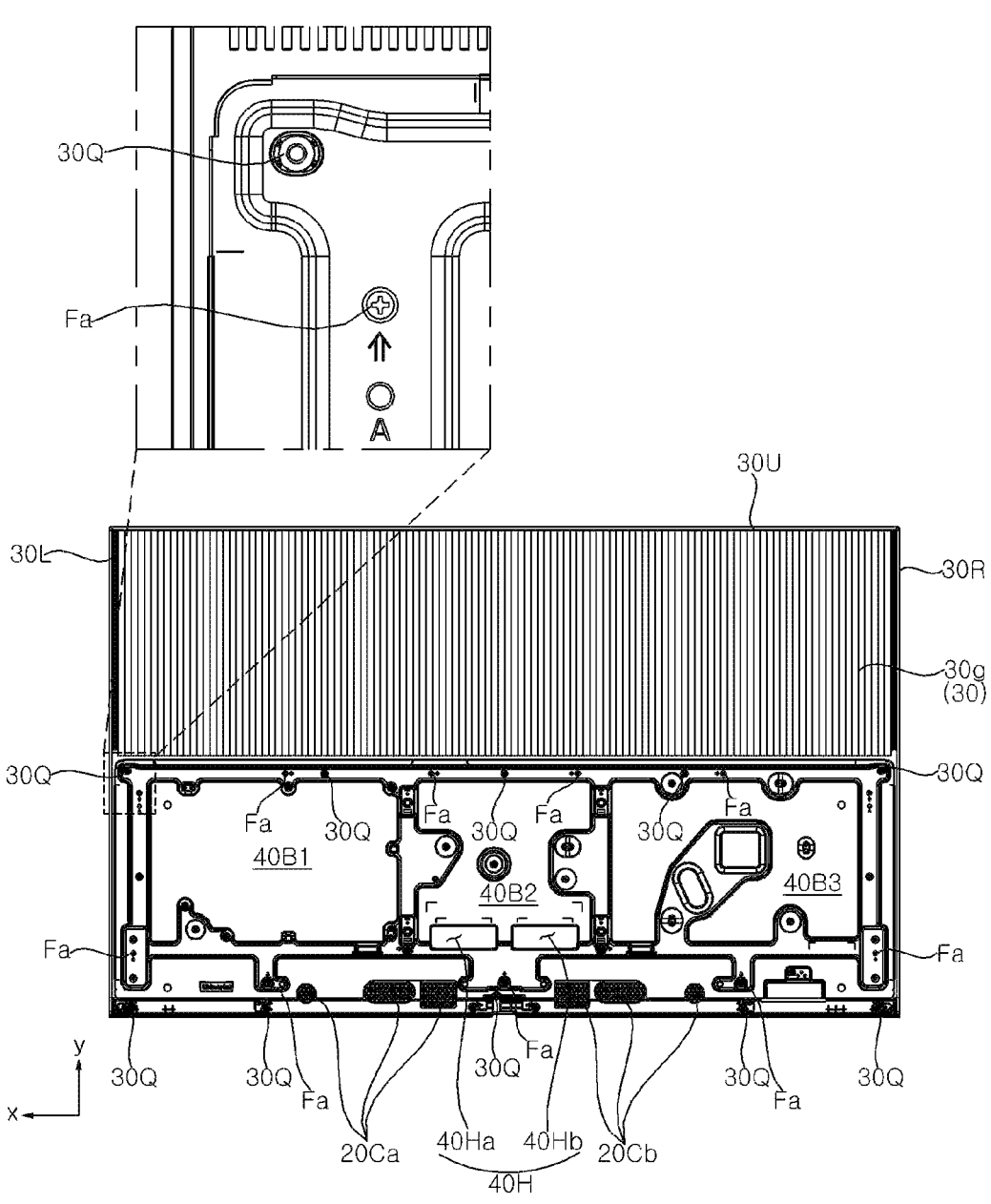

[FIG. 7]
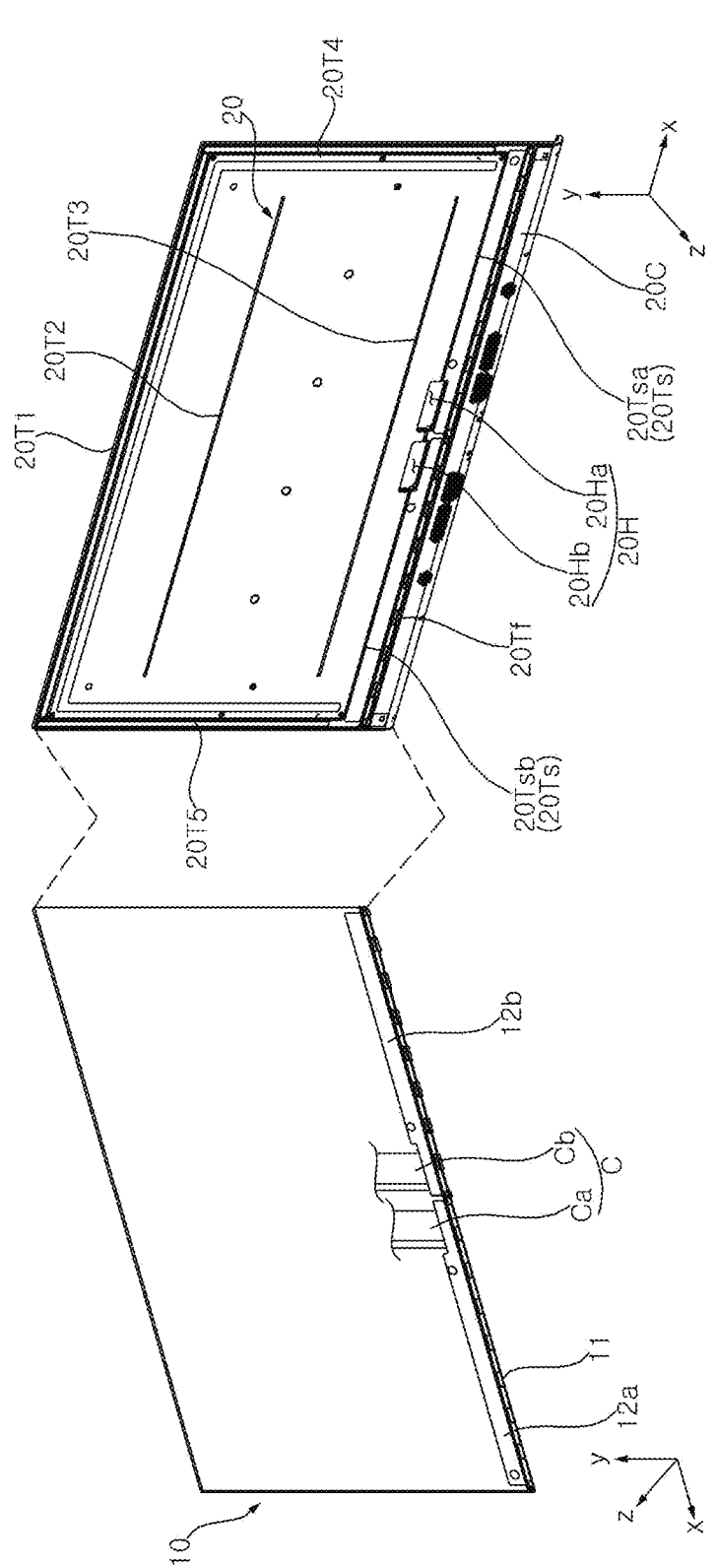

[FIG. 8]
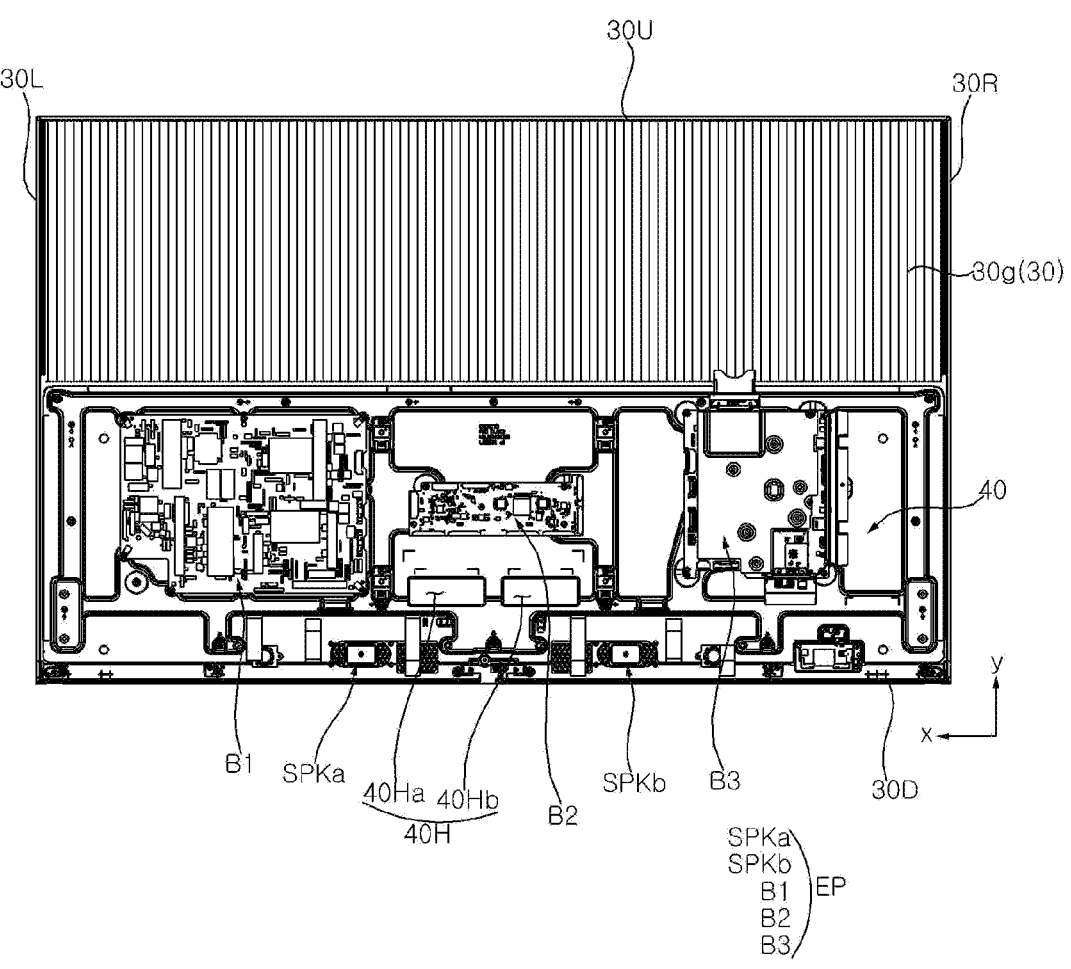

[FIG. 9]
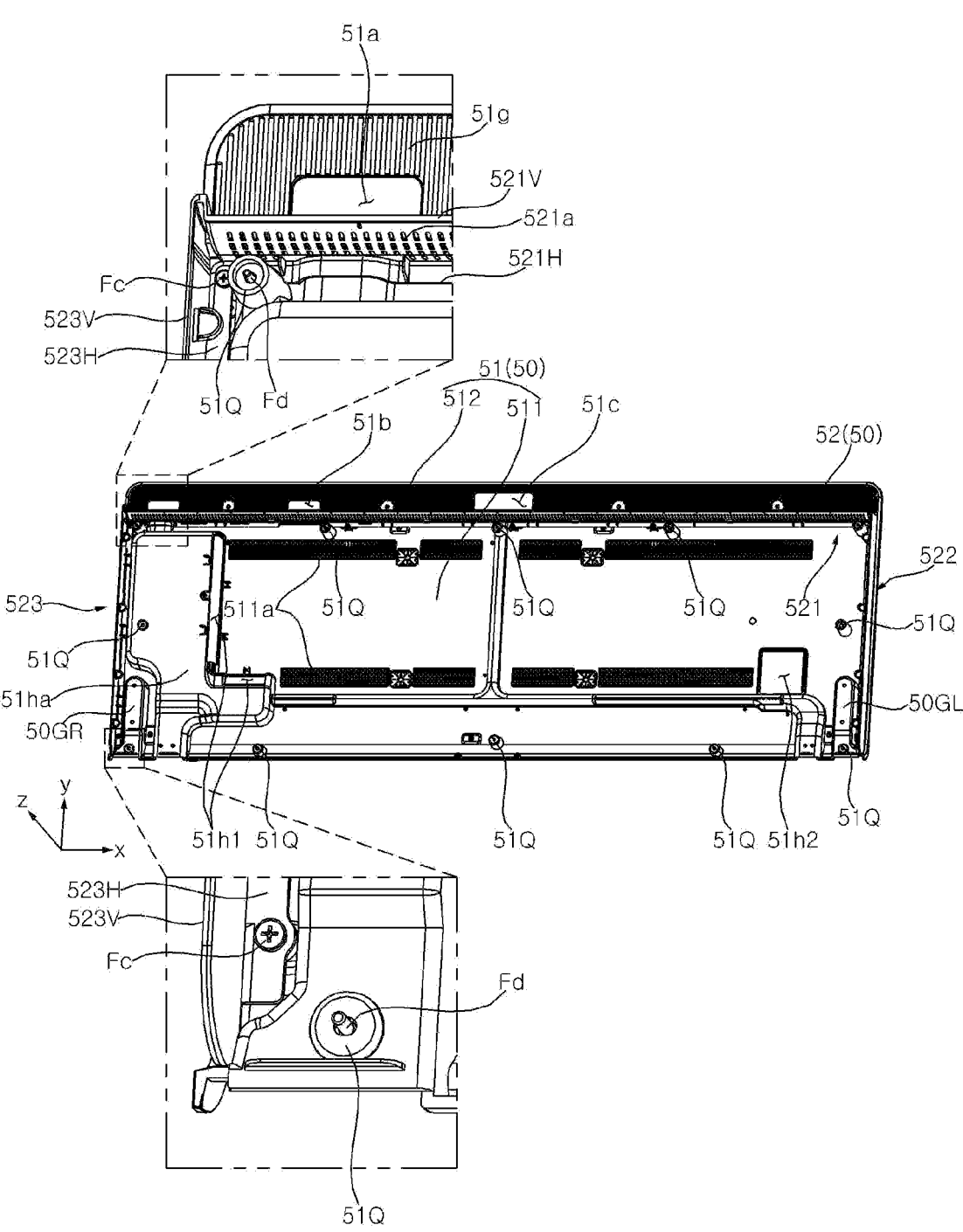

[FIG. 10]
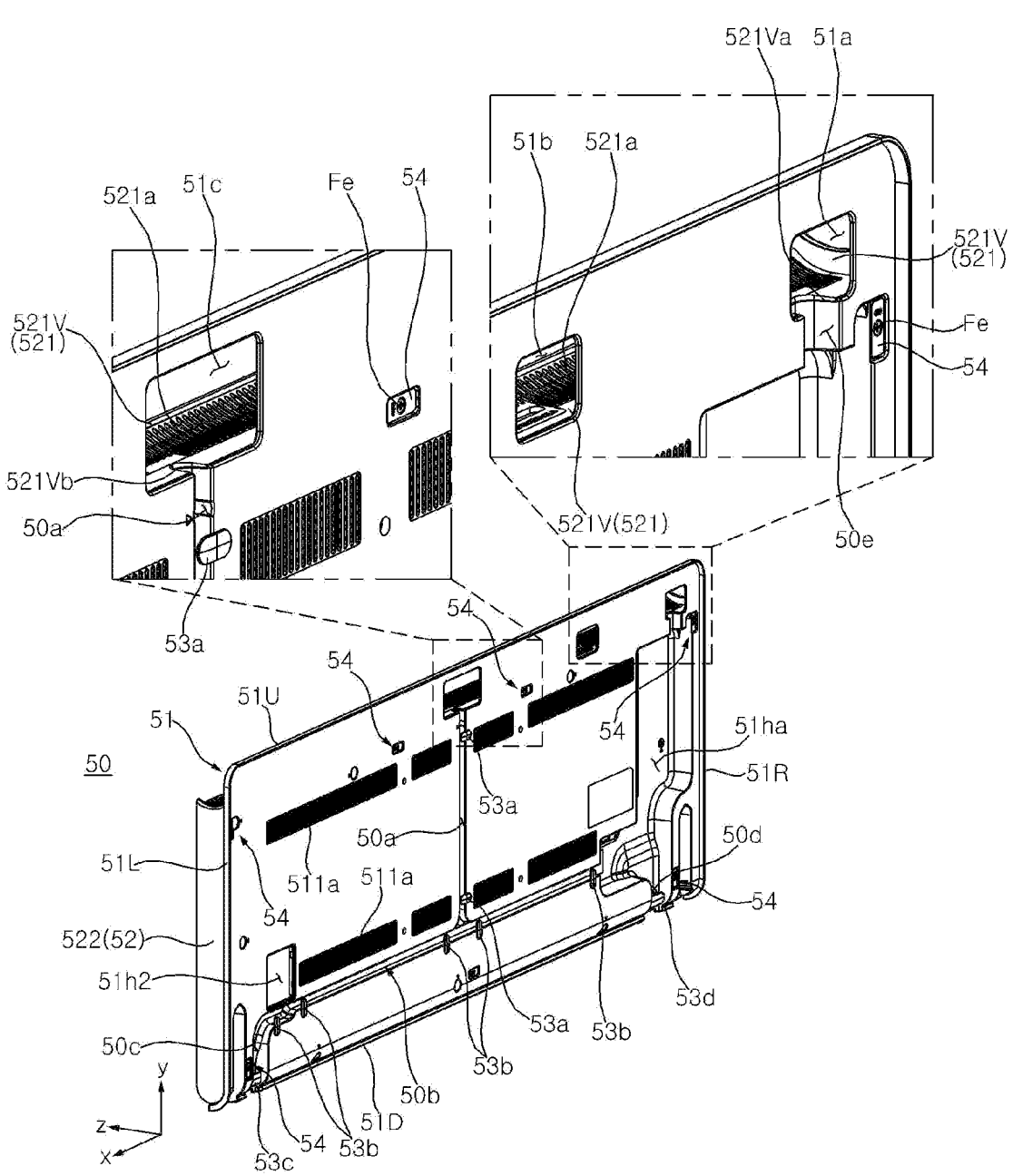

[FIG. 11]
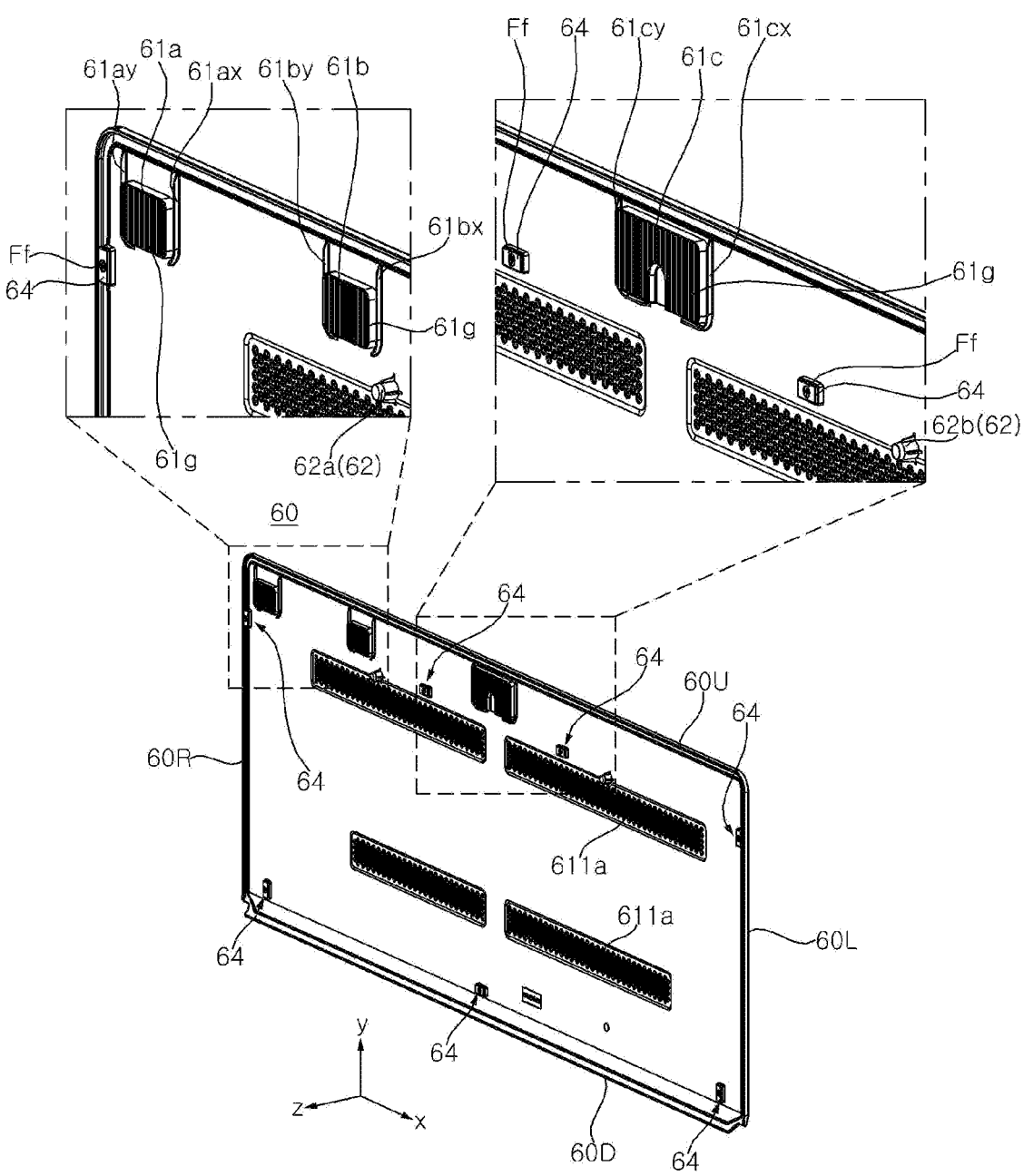

[FIG. 12]
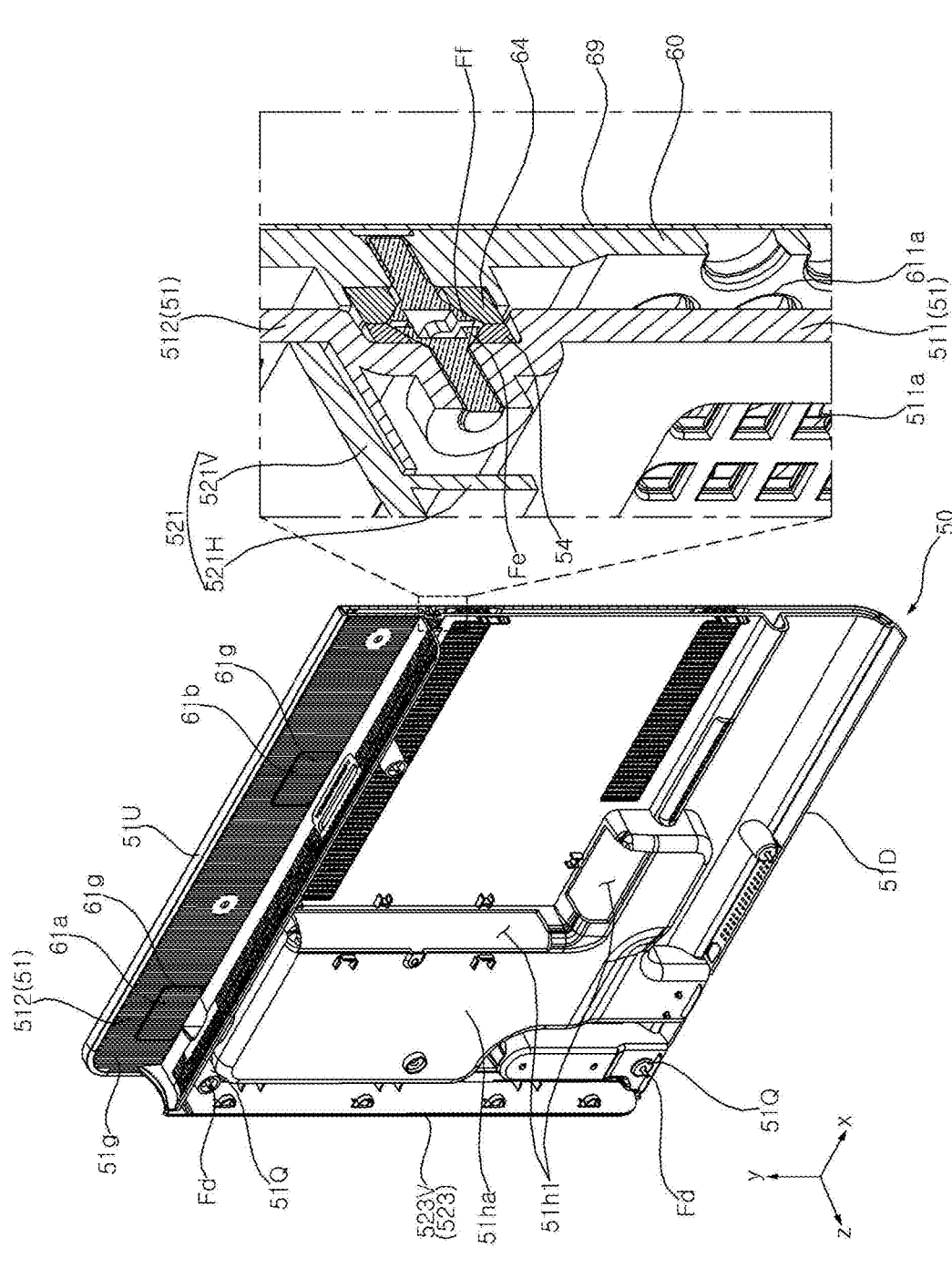

[FIG. 13]
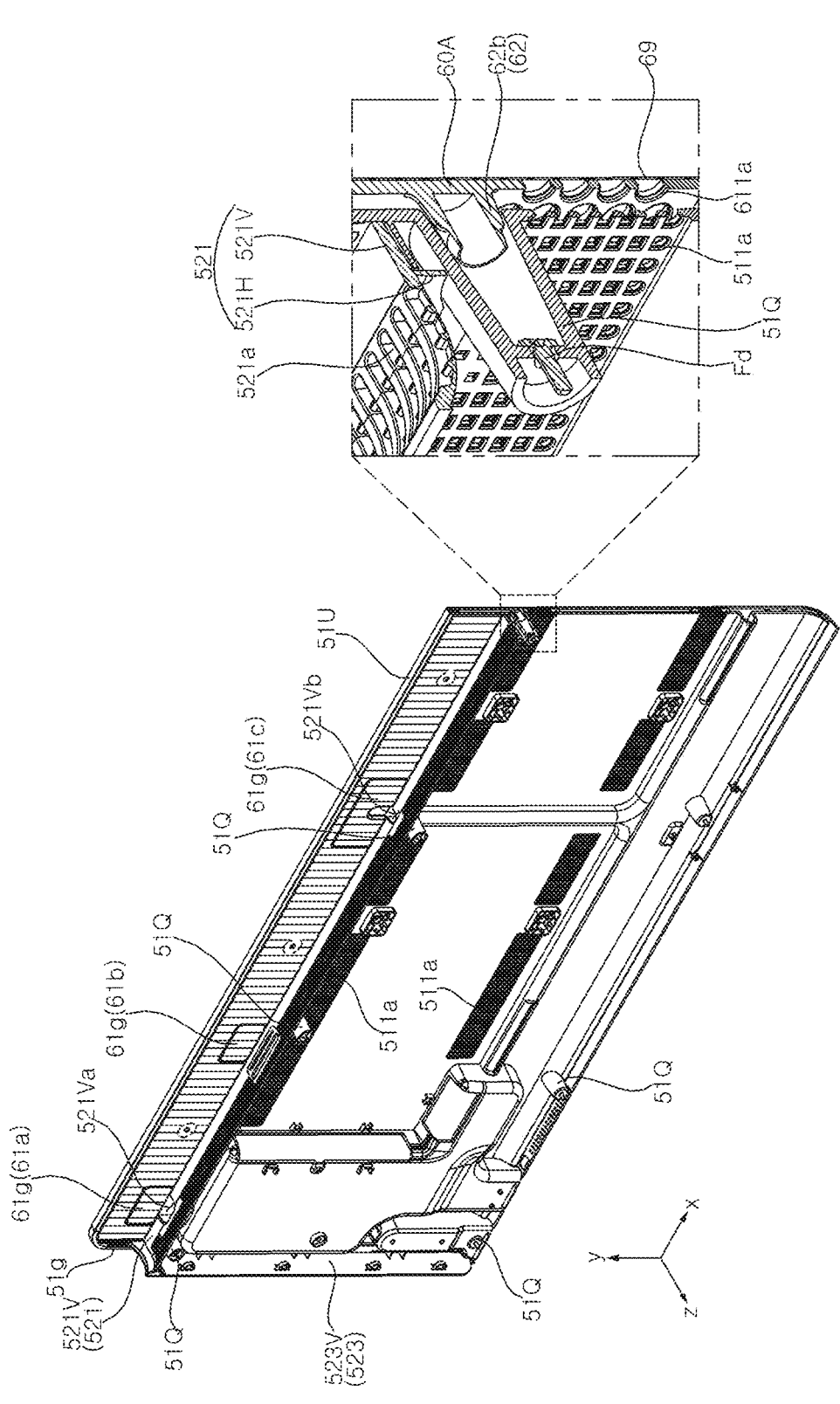

[FIG. 14]
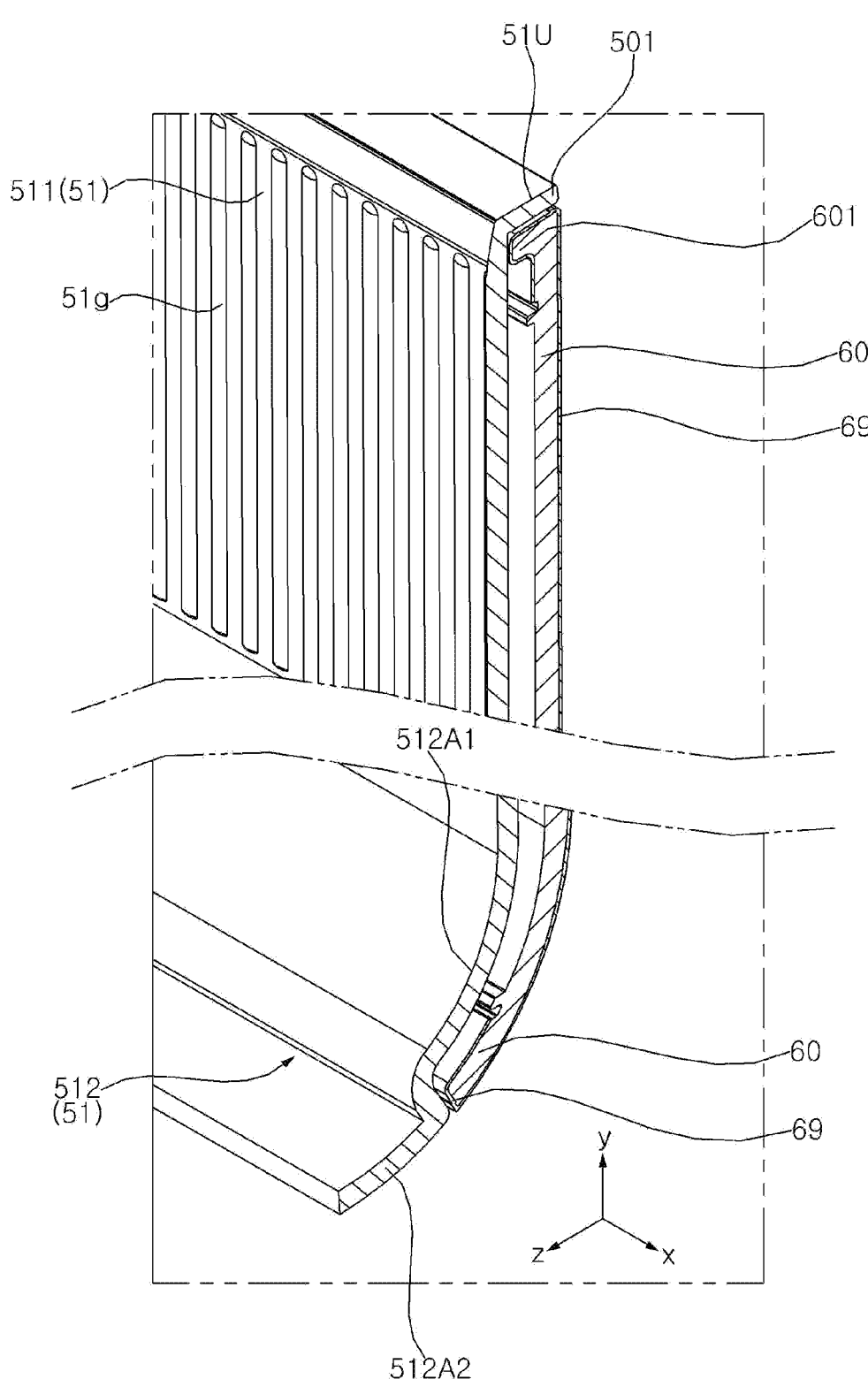

[FIG. 15]
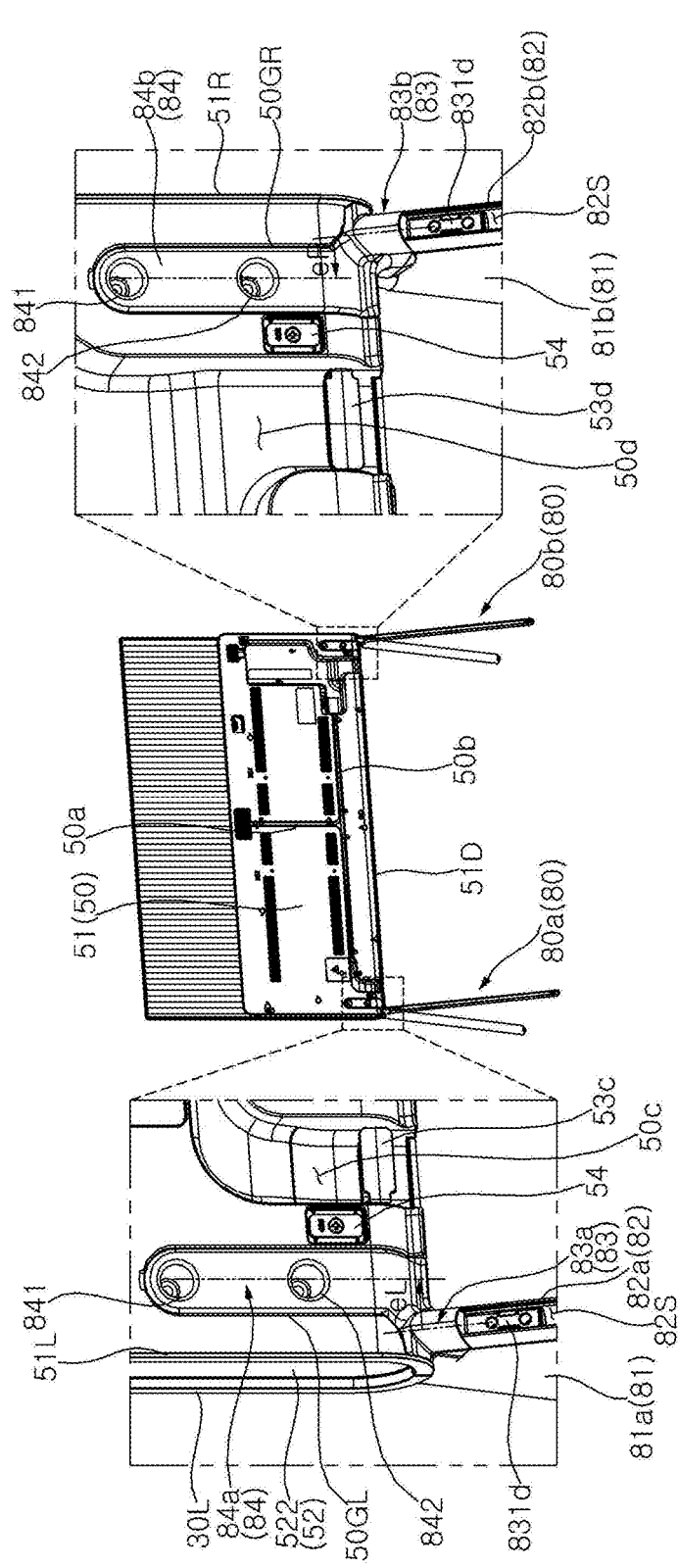

[FIG. 16]
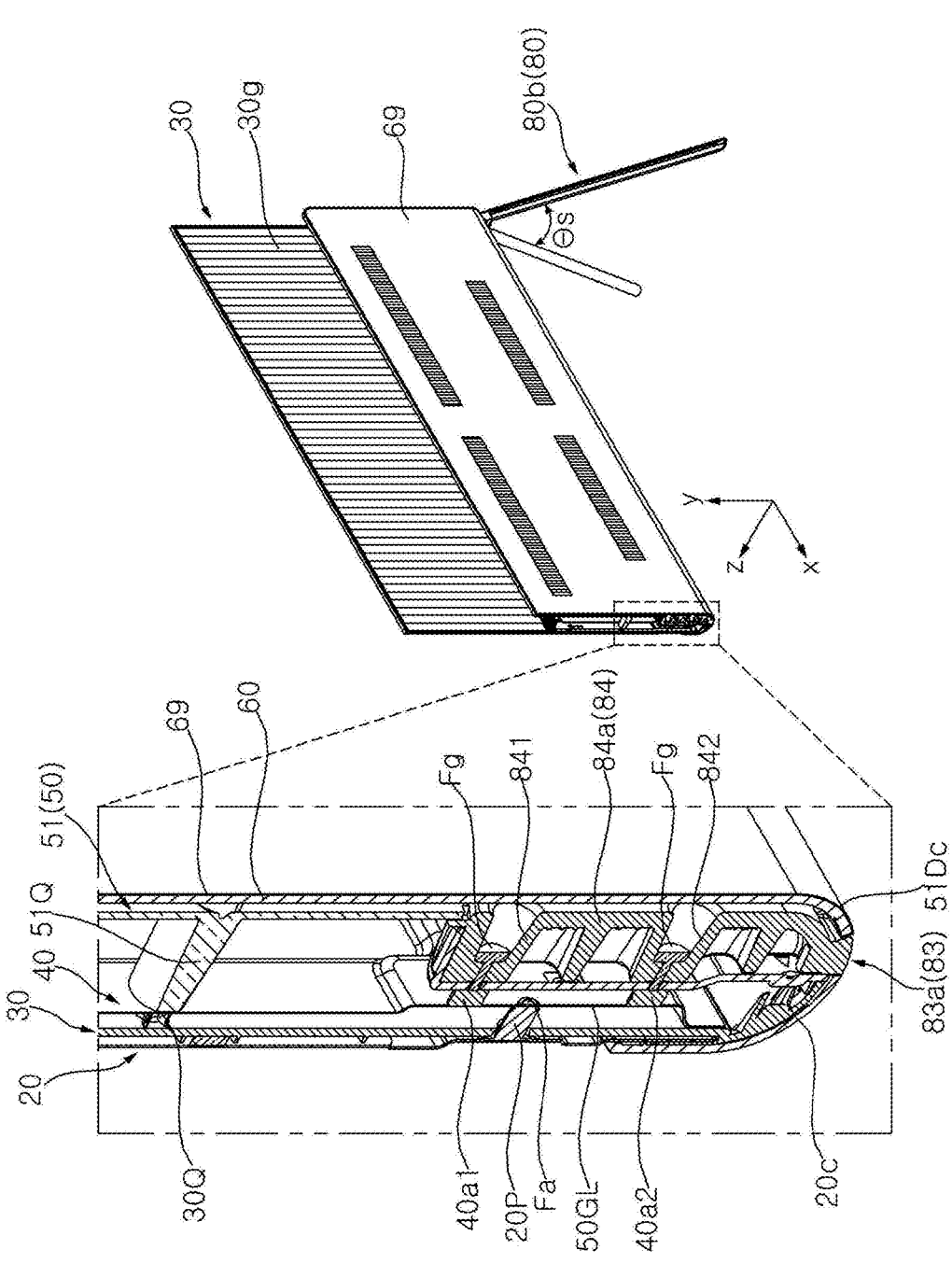

[FIG. 17]
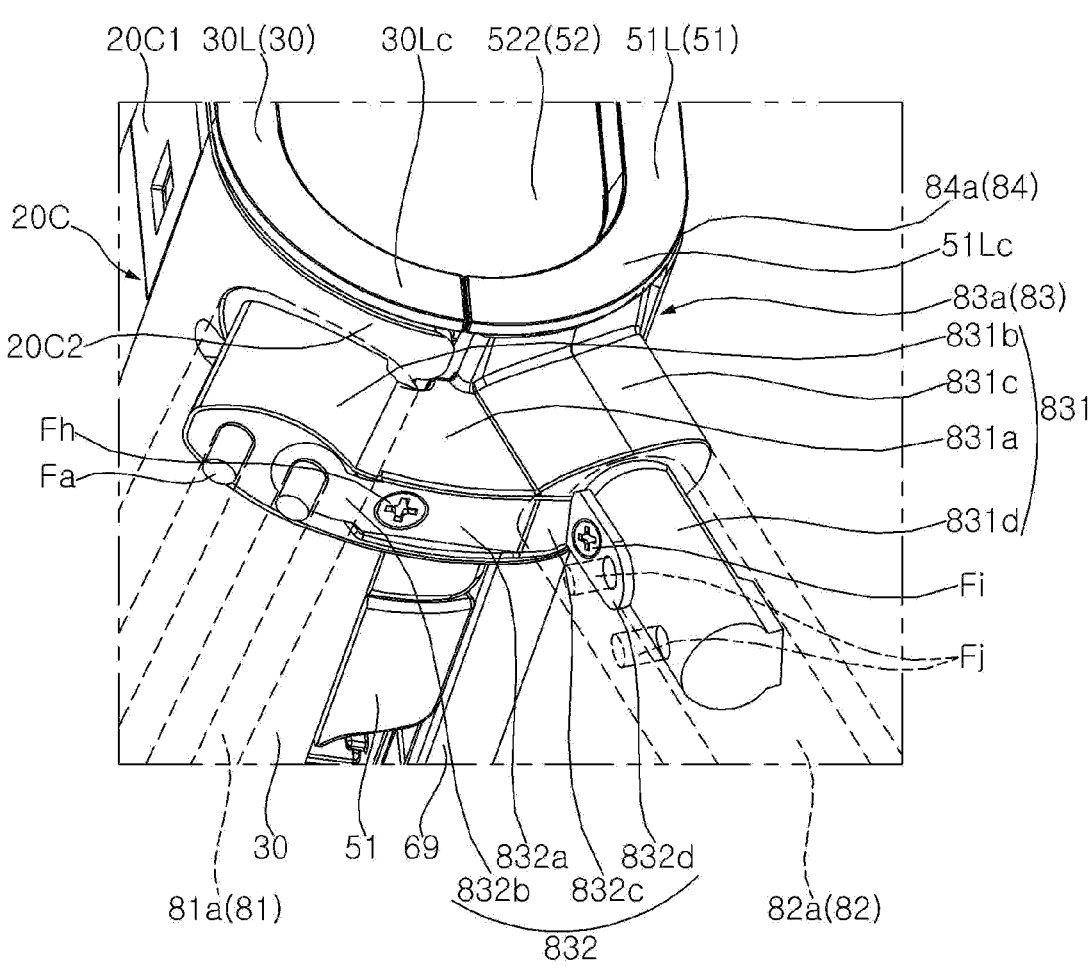

[FIG. 18]
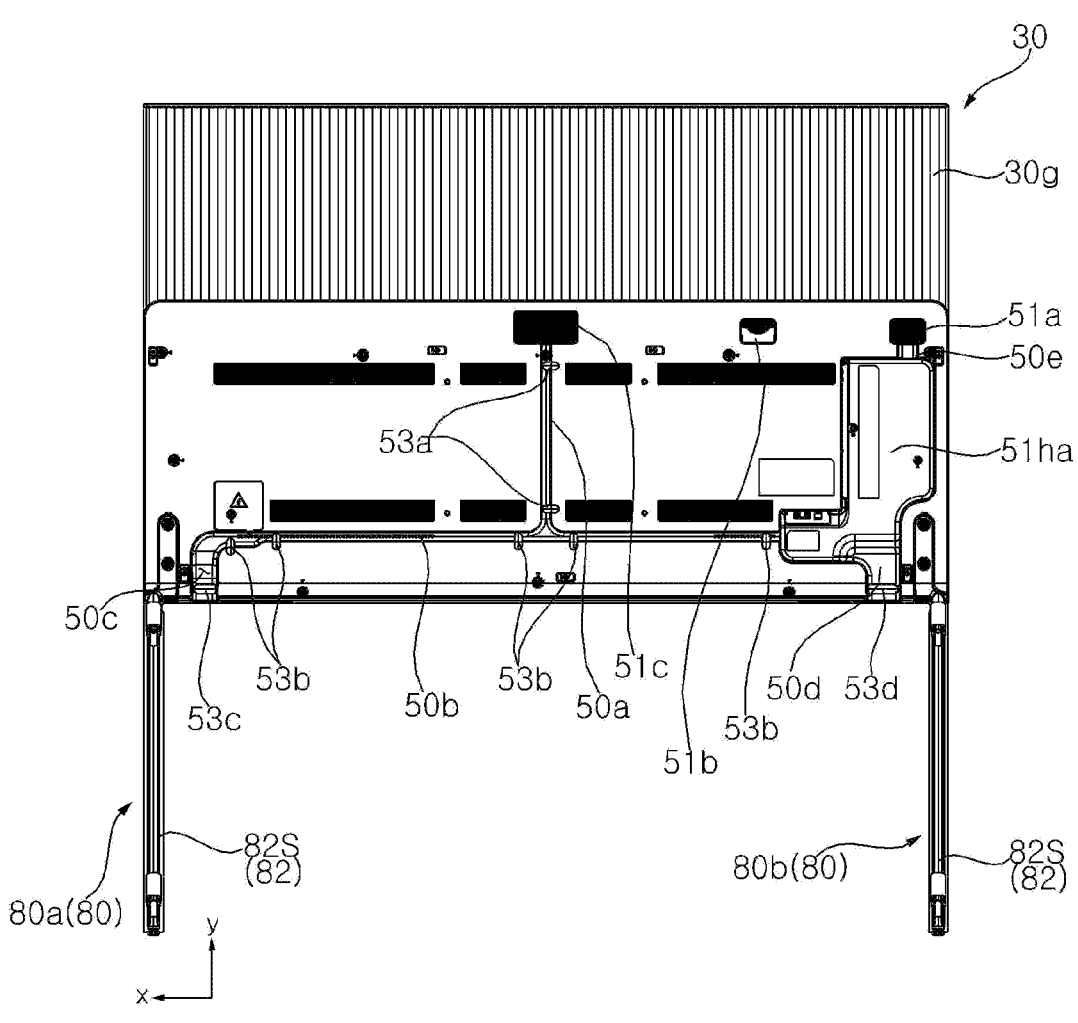

[FIG. 19]
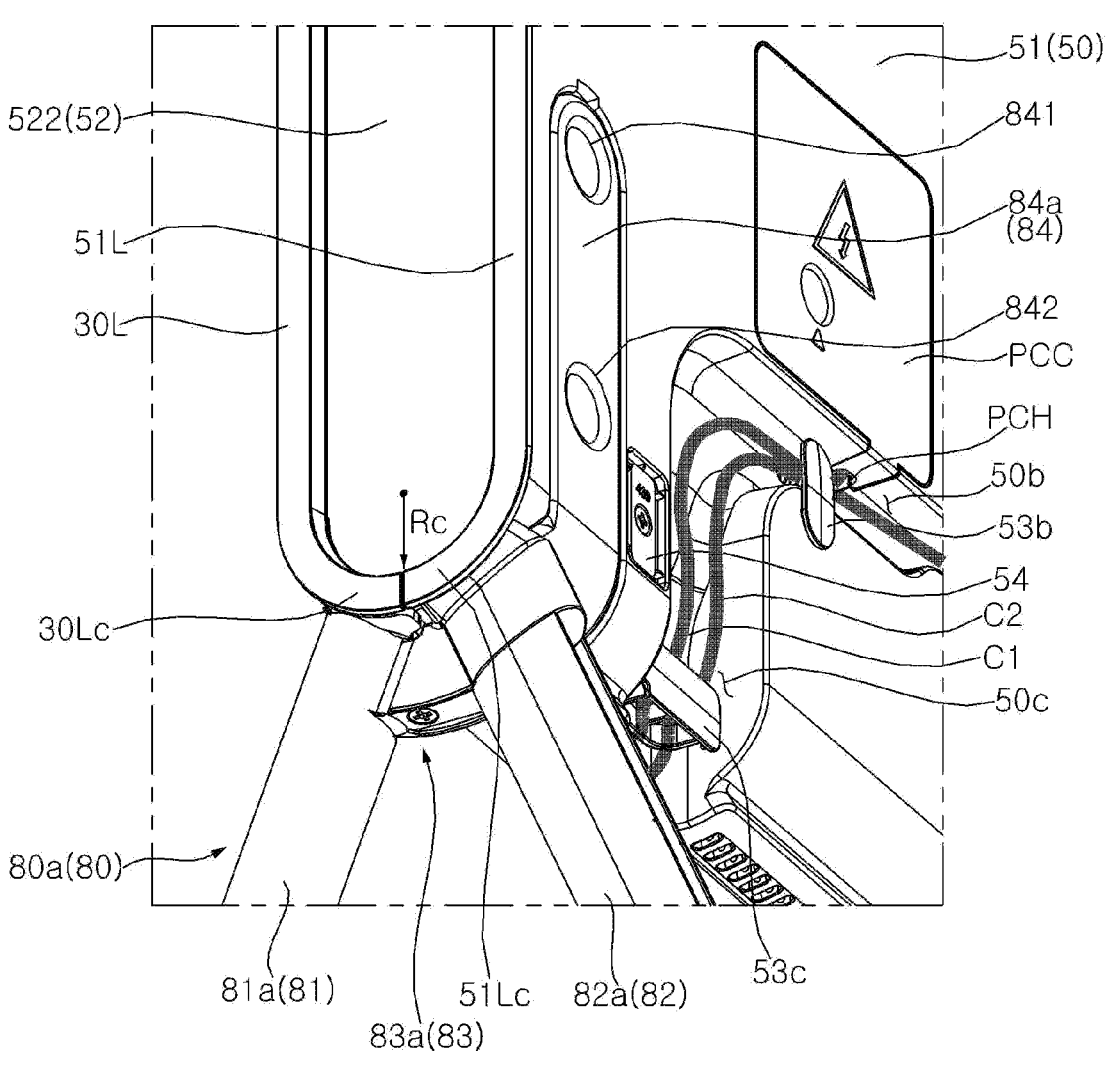

[FIG. 20]
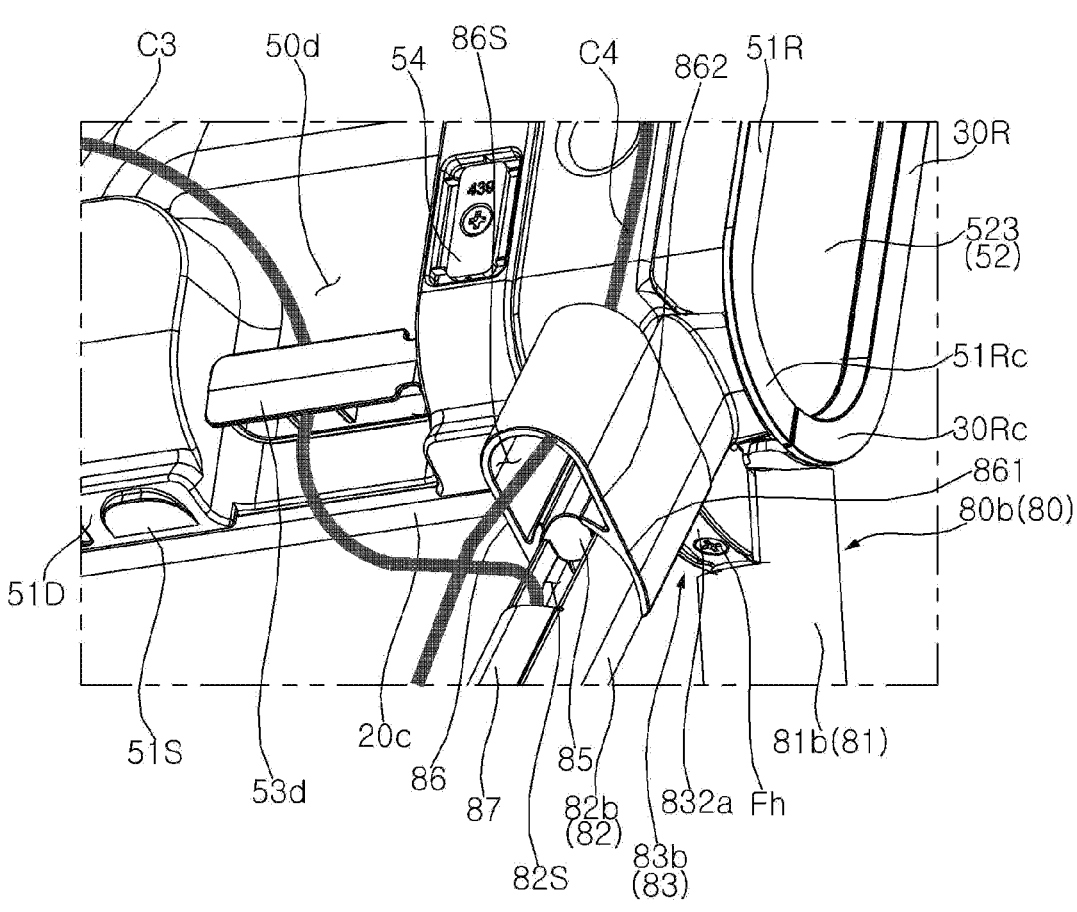

[FIG. 21]
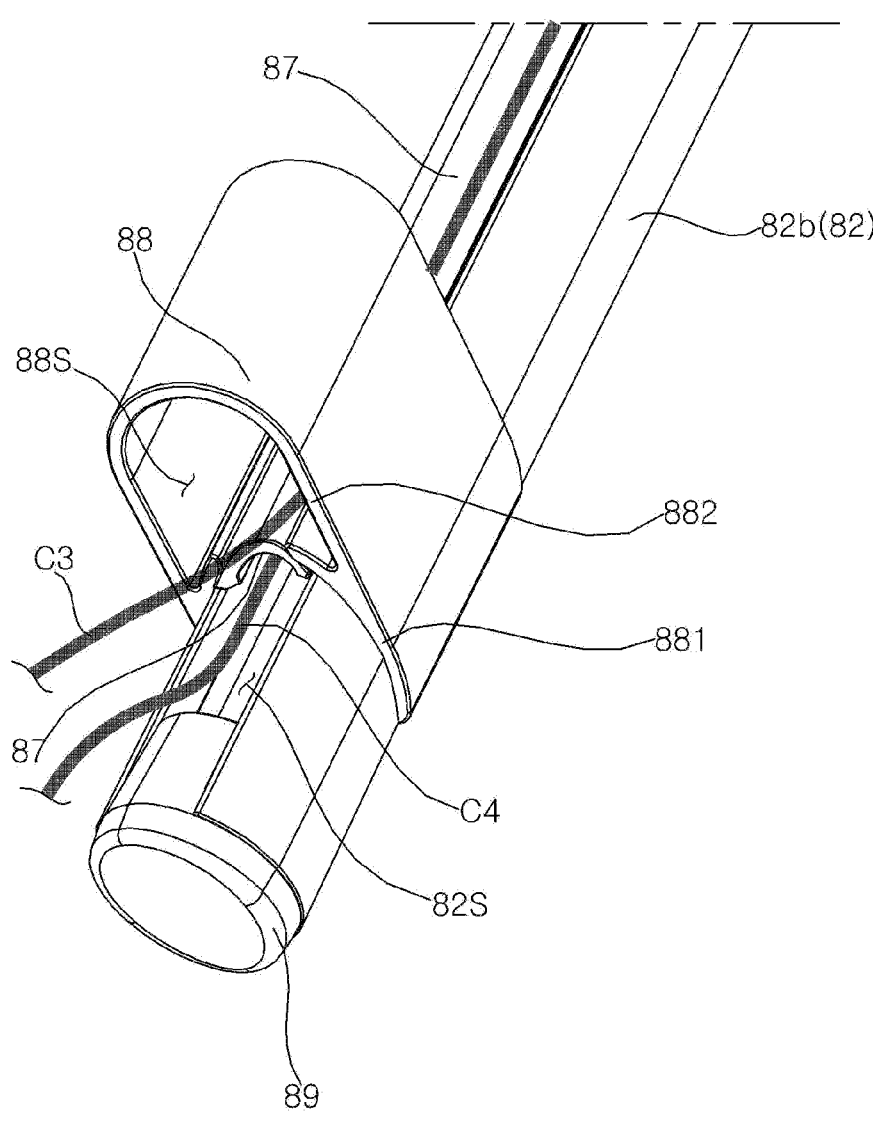

[FIG. 22]
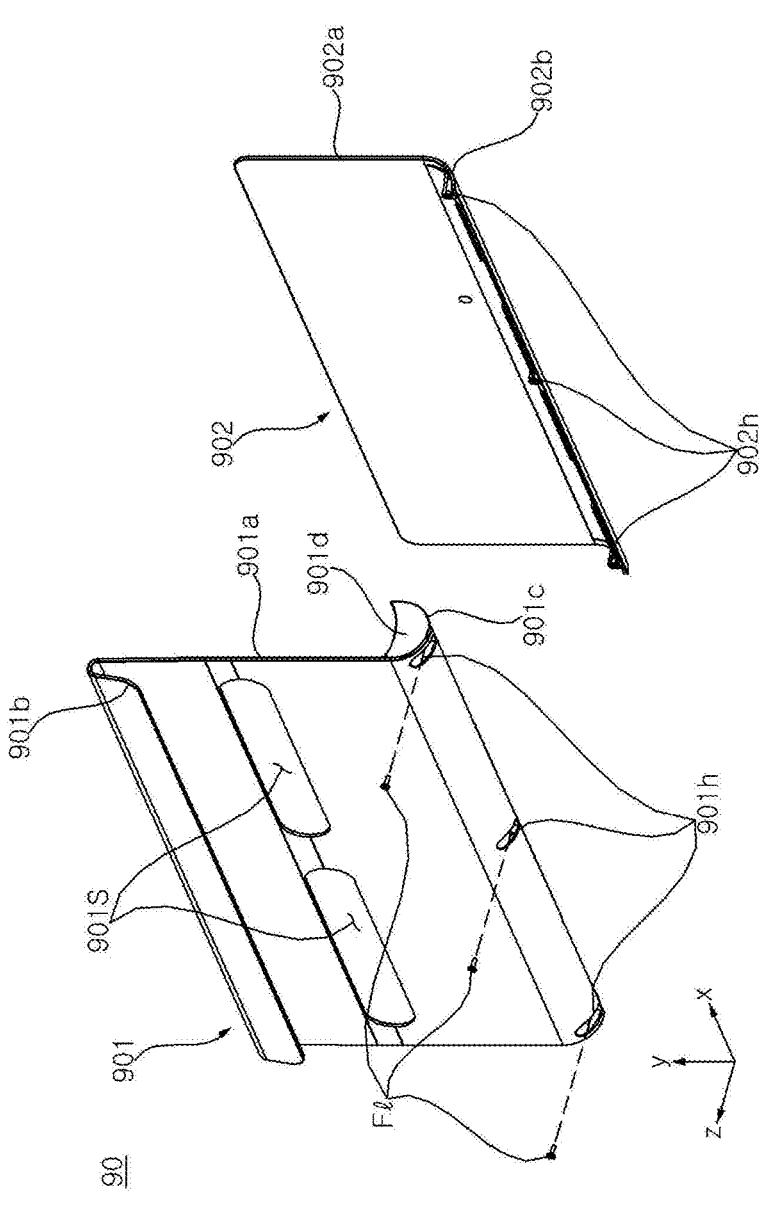

[FIG. 23]
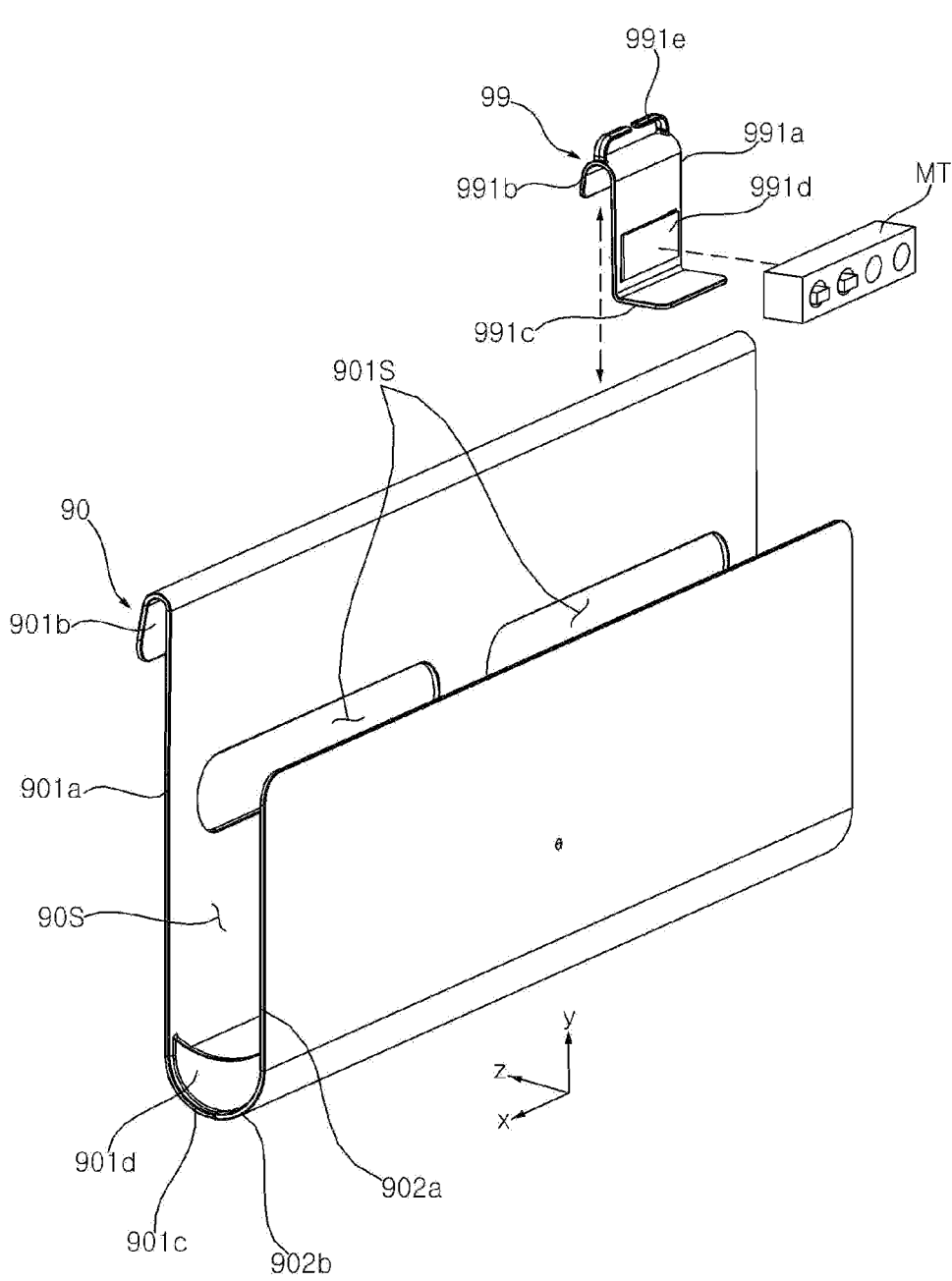

[FIG. 24]
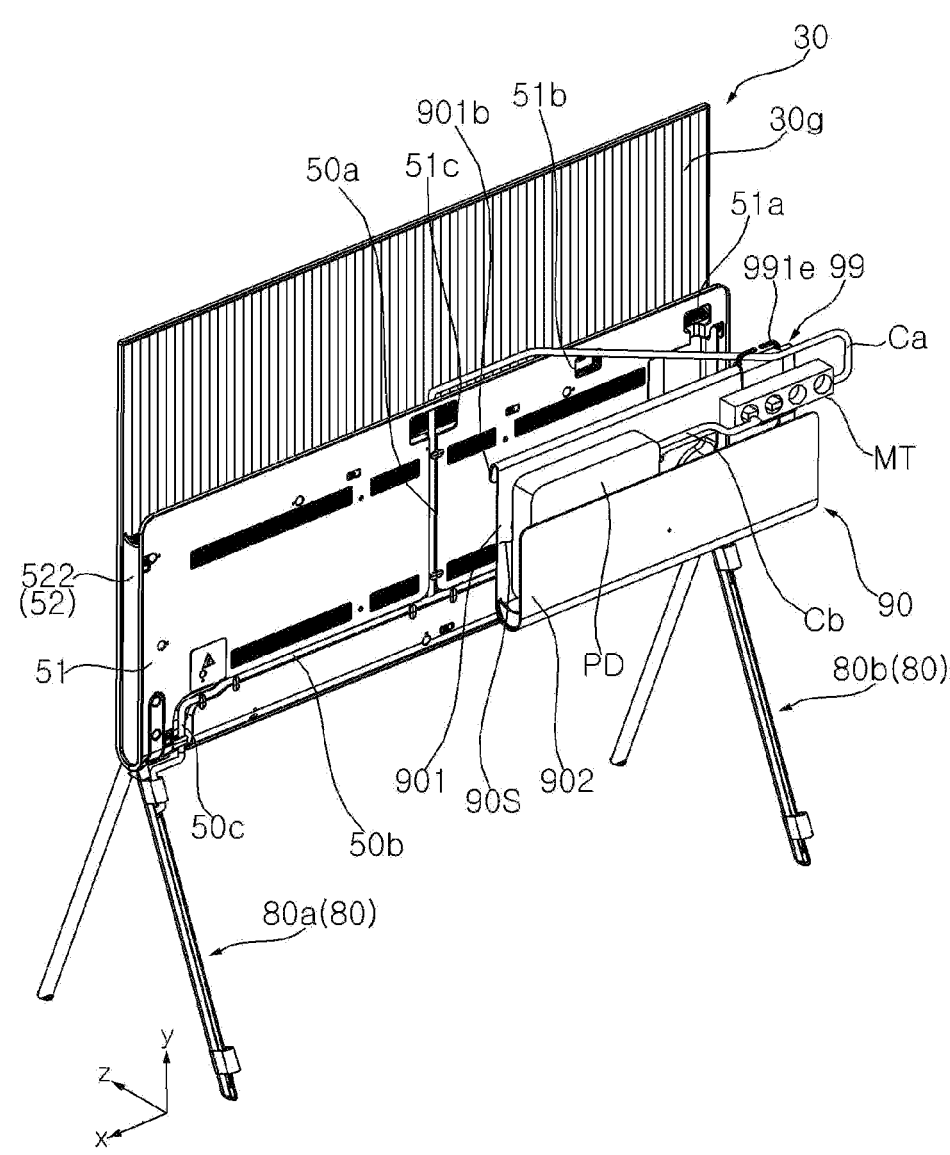

[FIG. 25]
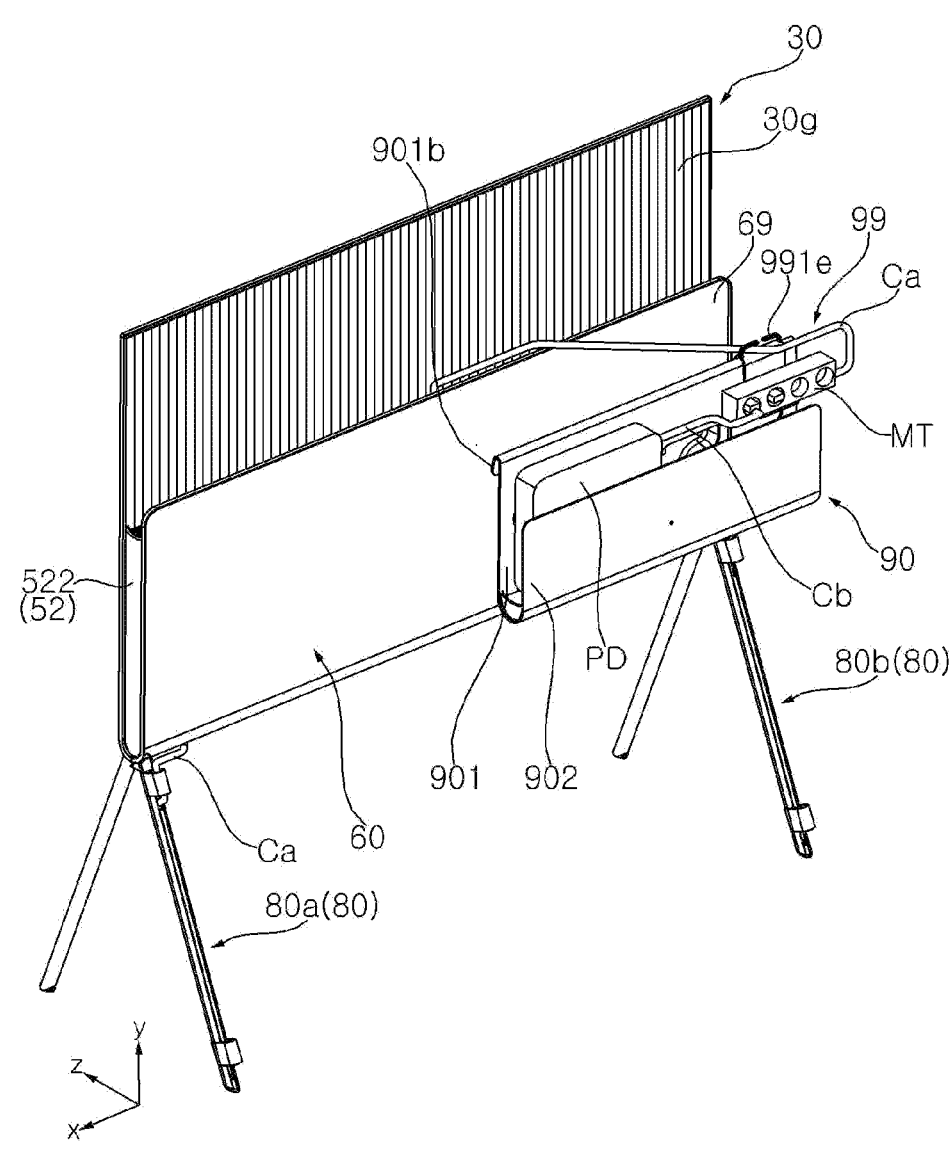

[FIG. 26]
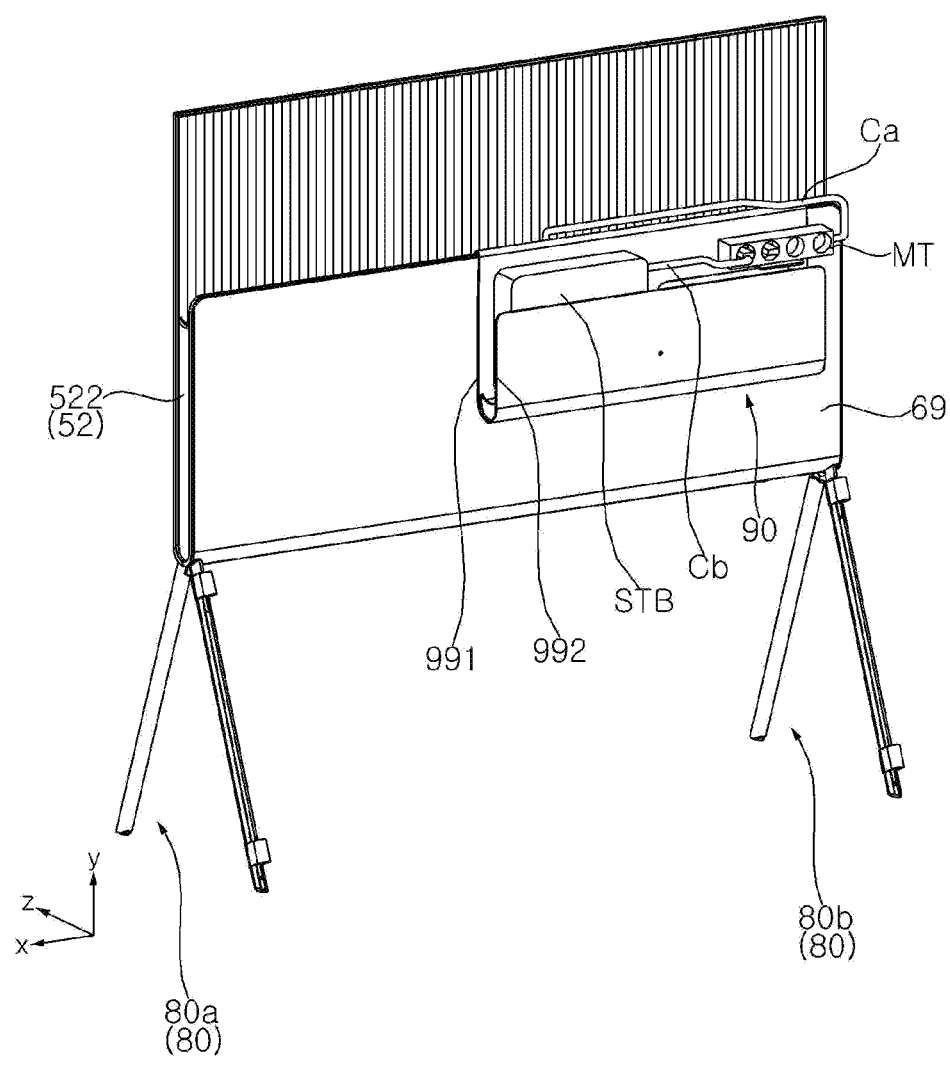

[FIG. 27]
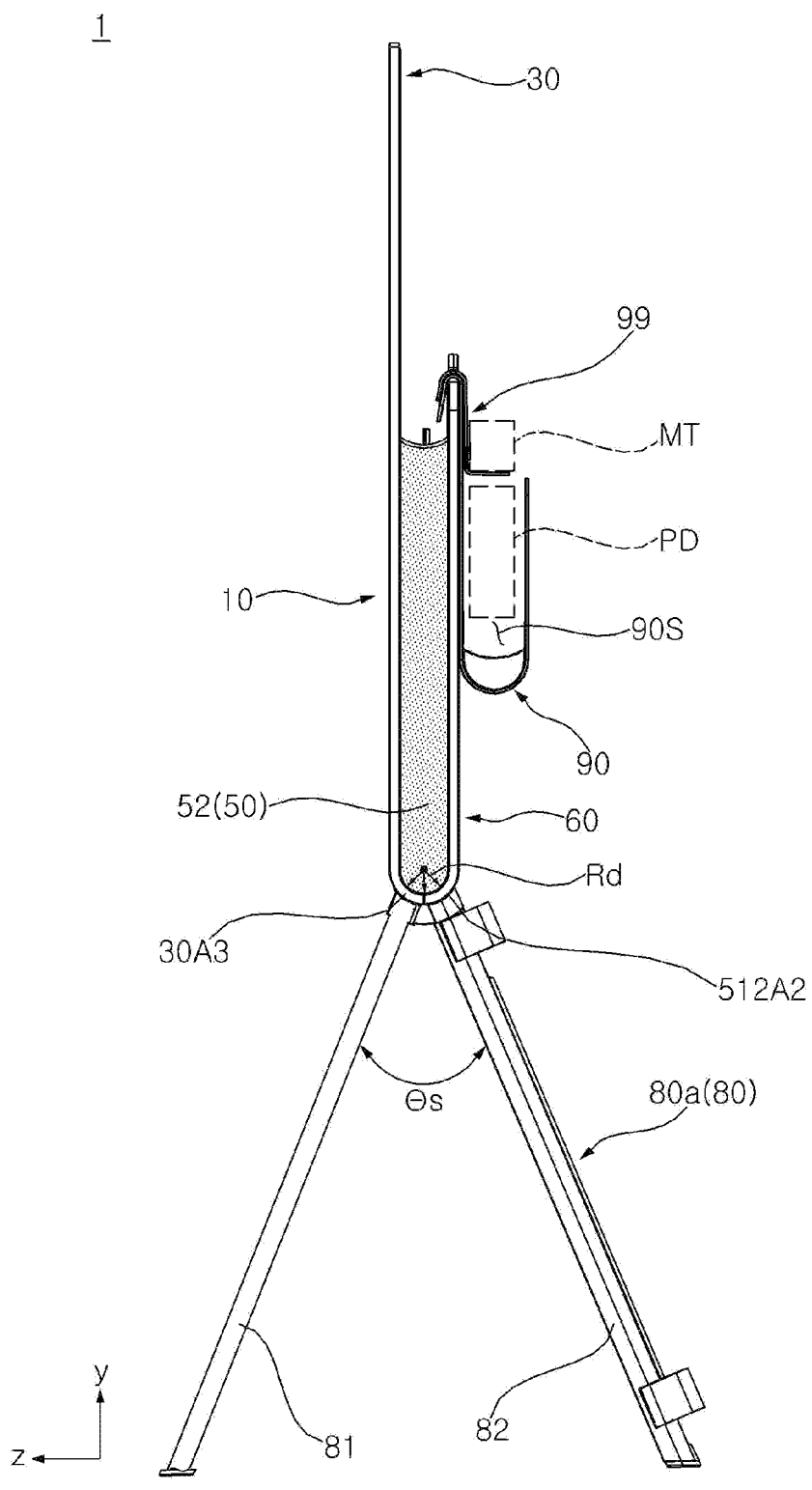

[FIG. 28]
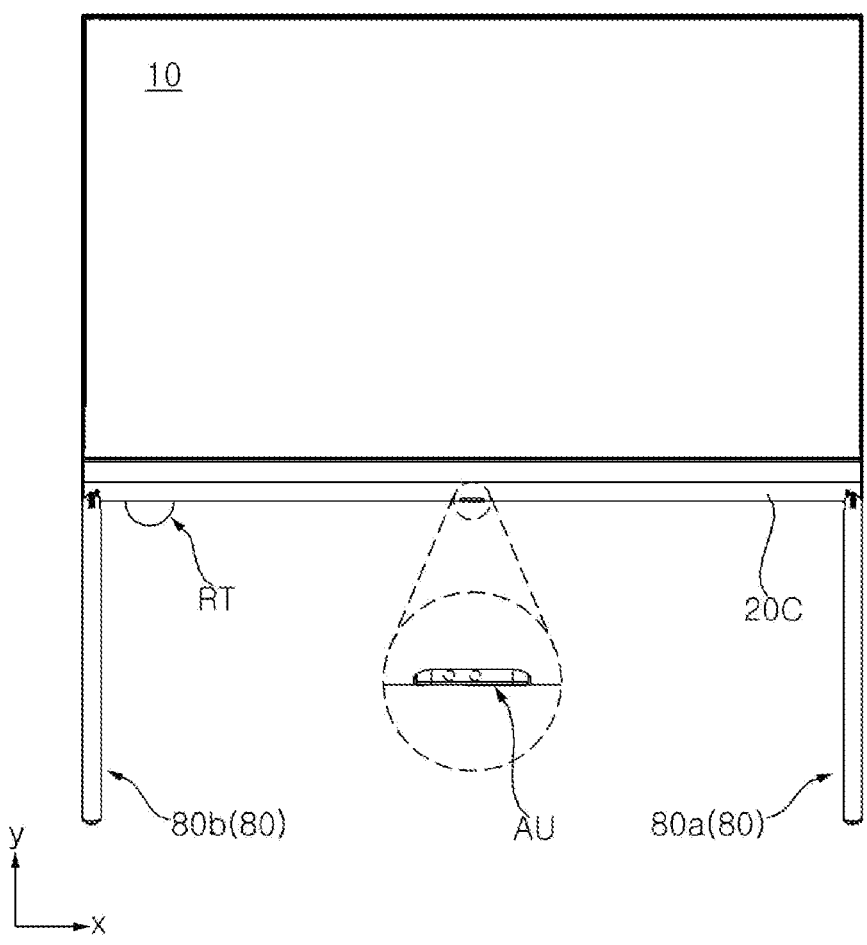

DISPLAY DEVICE WITH BASKET ATTACHED TO REAR COVER

CROSS REFERENCE TO RELATED APPLICATIONS

This application the National Phase of PCT International Application No. PCT/KR2022/004647, filed on Mar. 31, 2022, which is hereby expressly incorporated by reference into the present application.

TECHNICAL FIELD

The present disclosure relates to a display device.

BACKGROUND ART

As the information society develops, the demand for display devices is also increasing in various forms. In response to this, various display devices such as Liquid Crystal Display Device (LCD), Plasma Display Panel (PDP), Electroluminescent Display (ELD), Vacuum Fluorescent Display (VFD), and Organic Light Emitting Diode (OELD) have been researched and used in recent years.

Among them, the LCD panel includes a TFT substrate and a color substrate facing each other with a liquid crystal layer interposed therebetween, and may display an image using light provided from a backlight unit. In addition, the OLED panel may display an image by depositing an organic material layer capable of self-emitting light on a substrate on which a transparent electrode is formed.

Recently, a lot of research on a large-screen ultra-thin display device has been conducted.

DISCLOSURE OF INVENTION

Technical Problem

An object of the present disclosure is to solve the above and other problems.

Another object may be to provide a display device having a basket capable of accommodating peripheral devices in a rear of a back cover.

Another object may be to provide a display device having a bracket capable of holding a device such as a multi-tap.

Another object may be to provide a coupling structure of a back cover and a basket and a coupling structure of a basket and a bracket.

Another object may be to provide a back cover having a rear side in which a groove in which a cable is located is formed.

Another object may be to provide a cable path provided between a device provided in a basket or bracket and the groove of a back cover.

Another object may be to provide a stand which separates a display panel upward from a ground and has a cable groove in which a cable is located.

Solution to Problem

According to an aspect of the present disclosure for achieving the above object, there is provided a display device including: a display panel; a frame which is located in a rear of the display panel, and to which the display panel is coupled; a back cover which covers a rear of the frame, and which is coupled to the frame; and a basket which is located in a rear of the back cover, and which has an inner space, wherein an upper side of the back cover is spaced apart from an upper side of the frame in a rearward direction, and the basket spans the upper side of the back cover.

Advantageous Effects of Invention

Effects of the display device according to the present disclosure are described as follows.

According to at least one of the embodiments of the present disclosure, a display device having a basket capable of accommodating peripheral devices in a rear of a back cover may be provided.

According to at least one of the embodiments of the present disclosure, a display device having a bracket capable of holding a device such as a multi-tap may be provided.

According to at least one of the embodiments of the present disclosure, a coupling structure of a back cover and a basket and a coupling structure of a basket and a bracket may be provided.

According to at least one of the embodiments of the present disclosure, it is possible to provide a back cover having a rear side in which a groove in which a cable is located is formed.

According to at least one of the embodiments of the present disclosure, a cable path may be provided between a device provided in a basket or bracket and the groove of a back cover.

According to at least one of the embodiments of the present disclosure, it is possible to provide a stand which separates a display panel upward from a ground and has a cable groove in which a cable is located.

Further scope of applicability of the present disclosure will become apparent from the following detailed description. However, it should be understood that the detailed description and specific embodiments such as preferred embodiments of the present disclosure are given by way of example only, since various changes and modifications within the spirit and scope of the present disclosure may be clearly understood by those skilled in the art.

BRIEF DESCRIPTION OF DRAWINGS

FIGS. 1 to 28 are diagrams illustrating examples of a display device according to embodiments of the present disclosure.

MODE FOR INVENTION

Description will now be given in detail according to exemplary embodiments disclosed herein, with reference to the accompanying drawings. For the sake of brief description with reference to the drawings, the same or equivalent components may be denoted by the same reference numbers, and description thereof will not be repeated.

In general, suffixes such as "module" and "unit" may be used to refer to elements or components. Use of such suffixes herein is merely intended to facilitate description of the specification, and the suffixes do not have any special meaning or function.

In the present disclosure, that which is well known to one of ordinary skill in the relevant art has generally been omitted for the sake of brevity. The accompanying drawings are used to assist in easy understanding of various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that although the terms first, second, etc. may be used herein to describe various elements, these elements should not be limited by these terms. These terms are only used to distinguish one element from another.

It will be understood that when an element is referred to as being "connected with" another element, there may be intervening elements present. In contrast, it will be understood that when an element is referred to as being "directly connected with" another element, there are no intervening elements present.

A singular representation may include a plural representation unless context clearly indicates otherwise.

In the present application, it should be understood that the terms "comprises, includes," "has," etc. specify the presence of features, numbers, steps, operations, elements, components, or combinations thereof described in the specification, but do not preclude the presence or addition of one or more other features, numbers, steps, operations, elements, components, or combinations thereof.

Direction indications of up (U), down (D), left (Le), right (Ri), front (F), and rear (R) shown in the drawings are only for convenience of explanation, and the technical concept disclosed in this specification is not limited thereto.

Referring to FIG. 1, a display device 1 may include a display panel 10. The display panel 10 may display an image.

The display device 1 may include a first long side LS1, a second long side LS2 opposite the first long side LS1, a first short side SS1 adjacent to one end of the first long side LS1 and the second long side LS2, and a second Short Side SS2 opposite to the first short side SS1. Meanwhile, for convenience of explanation, the lengths of the first and second long sides LS1 and LS2 are illustrated and described as being longer than the lengths of the first and second short sides SS1 and SS2, but a case in which the lengths of the first and second long sides LS1 and LS2 are approximately equal to the lengths of the first and second short sides SS1 and SS2 may also be possible.

A direction parallel to the short side SS1, SS2 of the display panel 10 may be referred to as an up-down direction. A direction parallel to the long side LS1, LS2 of the display panel 10 may be referred to as a left-right direction. A direction perpendicular to the long side LS1, LS2 and the short side SS1, SS2 of the display panel 10 may be referred to as a front-rear direction.

A direction in which the display panel 10 displays an image may be referred to as a front (F, z), and a direction opposite to this may be referred to as a rear (R). The side of the first short side SS1 may be referred to as a left side (Le, x). The side of the second short side SS2 may be referred to as a right side Ri. The side of the first long side LS1 may be referred to as an upper side (U, y). The side of the second long side LS2 may be referred to as a lower side D.

Hereinafter, a display panel using an organic light emitting diode (OLED) will be described as an example, but the display panel applicable to the present disclosure is not limited thereto.

Referring to FIGS. 1 and 2, the display device 1 may include a display panel 10, a plate 20, a frame 30, a mount plate 40, an electronic part EP, a back cover 50, an end cover 60, a stand 80, and a basket 90.

The display panel 10 may divide an image into a plurality of pixels and output the image by adjusting color, brightness, and saturation for each pixel. The display panel 10 may be divided into an active area in which an image is displayed and a de-active area in which an image is not displayed. The display panel 10 may generate light corresponding to red, green, or blue color according to a control signal.

The plate 20 may be located in a rear of the display panel 10 and the display panel 10 may be coupled thereto. The plate 20 may include a metal material. For example, it may be a hot dipped galvanized iron GI or an electrolytic galvanized iron EGI. The plate 20 may be referred to as an inner plate.

The frame 30 may be located in a rear of the plate 20 and may be coupled to the plate 20. The frame 30 may be an injection molding product. For example, the frame 30 may include a plastic material. The frame 30 may be referred to as a main frame, a module cover, or a cover bottom.

The mount plate 40 may be located in a rear of the frame 30 and may be coupled to the frame 30. The mount plate 40 may include a metal material. The mount plate 40 may be referred to as a fixed plate or a PCB plate.

The electronic component EP may be located in a rear of the mount plate 40 and may be mounted in the mount plate 40.

The back cover 50 may be located in a rear of the mount plate 40 and the electronic component EP, and may be coupled to the mount plate 40. The back cover 50 may cover the rear of the mount plate 40 and the electronic component EP. The back cover 50 may be an injection molding product. For example, the back cover 50 may include a plastic material.

The end cover 60 may be located in a rear of the back cover 50, and may be coupled to the back cover 50. The rear side of the back cover 50 may be covered by the end cover 60. The end cover 60 may be an injection molding product. For example, the end cover 60 may include a plastic material.

The stand 80 may be located between the back cover 50 and the end cover 60, and may be coupled to the back cover 50. The back cover 50 may be spaced upward from a ground by the stand 80. The basket 90 may be located in a rear of the end cover 60, and may span the upper end of the end cover 60.

Referring to FIGS. 3 and 4, the size of the frame 30 may correspond to the size of the plate 20. The size of the frame 30 may be larger than the size of the plate 20, and the edges 30U, 30D, 30L, and 30R of the frame 30 may be located outside the edges 20U, 20D, 20L, and 20R of the plate 20. The size of the mount plate 40 may be smaller than the size of the frame 30. Alternatively, the size of the mount plate 40 may correspond to the size of the frame 30.

A first cable hole 20H may be adjacent to the lower side 20D of the plate 20, and may be formed by penetrating the plate 20 in the front-rear direction. The first cable hole 20H may include a first left cable hole 20Ha and a first right cable hole 20Hb spaced apart from each other along the lower side 20D.

A first speaker hole 20a, 20b may be formed toward the inside of the plate 20 from the lower side 20D of the plate 20. The first speaker hole 20a, 20b may be formed by cutting out a part of the lower side 20D of the plate 20. The first speaker hole 20a, 20b may include a first left speaker hole 20a and a first right cable hole 20b spaced apart from each other along the lower side 20D.

A second cable hole 30H may be adjacent to the lower side 30D of the frame 30, and may be formed by penetrating the frame 30 in the front-rear direction. The second cable hole 30H may include a second left cable hole 30Ha and a second right cable hole 30Hb spaced apart from each other along the lower side 30D.

A second speaker hole 30a, 30b may be located between the lower side 30D of the frame 30 and the second cable hole 30H, and may be formed by penetrating the frame 30 in the front-rear direction. The second speaker hole 30a, 30b may include a second left speaker hole 30a and a second right speaker hole 30b spaced apart from each other along the lower side 30D.

A third cable hole 40H may be adjacent to the lower side 40D of the mount plate 40, and may be formed by penetrating the mount plate 40 in the front-rear direction. The third cable hole 40H may include a third left cable hole 40Ha and a third right cable hole 40Hb spaced apart from each other along the lower side 40D.

A third speaker hole 40a, 40b may be formed toward the inside of the mount plate 40 from the lower side 40D of the mount plate 40. The third speaker hole 40a, 40b may be formed by cutting out a part of the lower side 40D of the mount plate 40. The third speaker hole 40a, 40b may include a third left speaker hole 40a and a third right speaker hole 40b spaced apart from each other along the lower side 40D.

In the front-rear direction, the first cable hole 20H may be aligned with the second cable hole 30H and the third cable hole 40H. In the front-rear direction, the first speaker hole 20a, 20b may be aligned with the second speaker hole 30a, 30b and the third speaker hole 40a, 40b.

Meanwhile, a front cover 20C may be adjacent to the lower side 20D of the plate 20, and may extend along the lower side 20D. The front cover 20C may face the frame 30 with respect to the plate 20. A fourth speaker hole 20Ca, 20Cb may be formed in the front cover 20C. In the front-rear direction, the fourth speaker hole 20Ca, 20Cb may be aligned with the first speaker hole 20a, 20b. For example, the front cover 20C may include a plastic material. In addition, the front cover 20C may include a fabric material.

Referring to FIGS. 5 and 6, the frame 30 may be coupled or attached to the rear side of the plate 20 through a plurality of adhesive members 30T1, 30T2, 30T3, 30T4, 30T5, and 30T6 (see FIG. 4). For example, the plurality of adhesive members 30T1, 30T2, 30T3, 30T4, 30T5, and 30T6 may be a double-sided tape.

The frame 30 may include a first part 30A1, a second part 30A2, and a third part 30A3. The first part 30A1 and the second part 30A2 may be commonly referred to as a flat portion, and the third part 30A3 may be referred to as a curved portion.

The first part 30A1 may be formed flat as a whole, and may have a second cable hole 30H (see FIG. 4).

The second part 30A2 may be a part of the frame 30 located above the first part 30A1. In the up-down direction, the length of the second part 30A2 may be the same as or similar to the length of the first part 30A1. A pattern 30g may be formed on the rear side of the second part 30A2. For example, the pattern 30g may be embossed vertical stripes.

The third part 30A3 may be a part of the frame 30 located below the first part 30A1. For example, the third part 30A3 may be curved in a rearward direction from the lower end of the first part 30A1. In the up-down direction, the length of the third part 30A3 may be smaller than the length of the first part 30A1. The lower side 20D (see FIG. 3) of the plate 20 may be located on or above a boundary between the first part 30A1 and the third part 30A3.

The mount plate 40 may be located in a rear of the first part 30A1 of the frame 30. The size of the mount plate 40 may correspond to the size of the first part 30A1. That is, the second part 30A2 of the frame 30 may not be covered by the mount plate 40.

A fixing portion 20P may protrude in a rearward direction from the rear side of the plate 20, and penetrate the first part 30A1 of the frame 30. A plurality of fixing portions 20P may be spaced apart from each other. For example, the plurality of fixing portions 20P may be disposed along the circumference of the first part 30A1. The fixing portion 20P may be aligned with a hole (no reference numeral) formed in the mount plate 40. A fastening member Fa such as a screw may be fastened to the fixing portion 20P through the hole of the mount plate 40. The plurality of fastening members Fa may be fastened to the plurality of fixing portions 20P. That is, the mount plate 40 may be coupled to the plate 20. Accordingly, the frame 30 may be coupled to the plate 20 and the mount plate 40 at between the plate 20 and the mount plate 40.

A coupling portion 30Q may protrude in a rearward direction from the rear side of the first part 30A1 and the rear side of the third part 30A3, and may be spaced apart from the fixing portion 20P. A plurality of coupling portions 30Q may be spaced apart from each other. For example, the plurality of coupling portions 30Q may be disposed along the circumferences of the first part 30A1 and the third part 30A3. The coupling portion 30Q may penetrate the mount plate 40. A plurality of holes (no reference numeral) may be formed in the mount plate 40, and a plurality of coupling portions 30Q may pass therethrough.

Referring to FIG. 7, the display panel 10 may be located in front of the plate 20. A plurality of adhesive members 20T1, 20T2, 20T3, 20T4, and 20T5 may be located between the display panel 10 and the plate 20, and may be coupled or attached to the rear side of the display panel 10 and the front side of the plate 20. For example, the plurality of adhesive members 20T1, 20T2, 20T3, 20T4, and 20T5 may be a double-sided tape. Accordingly, the display panel 10 may be coupled to the plate 20. At this time, the display panel 10 may be disposed parallel to the plate 20.

A lower adhesive member 20Tf may be located above the front cover 20C, and may be coupled or attached to the front side of the plate 20. The plurality of lower adhesive members 20Tf may be spaced apart from each other along the front cover 20C. The lower adhesive member 20Tf may be referred to as a cable adhesive member.

An upper adhesive member 20Ts may be located between the lower adhesive member 20Tf and the first cable hole 20H, and may be coupled or attached to the front side of the plate 20. A first upper adhesive member 20Tsa may extend toward the left side of the plate 20 from a portion of the plate 20 adjacent to a first left cable hole 20Ha. A second upper adhesive member 20Tsb may extend toward the right side of the plate 20 from a portion of the plate 20 adjacent to a first right cable hole 20Hb. The upper adhesive member 20Ts may be referred to as a substrate adhesive member.

A source PCB 12a, 12b may be adjacent to a lower side of the display panel 10, and may extend along the lower side. In the front-rear direction, a first source PCB 12a may be aligned with a first upper adhesive member 20Tsa, and a second source PCB 12b may be aligned with a second upper adhesive member 20Tsb.

A source chip-on-film (COF) 11 may be located between the lower side of the display panel 10 and the source PCB 12a, 12b, and may be electrically connected to the display panel 10 and the source PCB 12a, 12b. In the front-rear direction, the plurality of source COFs 11 may be aligned to the plurality of lower adhesive members 20Tf.

A cable C such as a flexible flat cable (FFC) may be electrically connected to the source PCB 12*a*, 12*b*. A first cable Ca may be electrically connected to a first source PCB 12*a*, and may extend to the rear of the frame 30 by penetrating the first left cable hole 20Ha. A second cable Cb may be electrically connected to a second source PCB 12*b*, and may extend to the rear of the frame 30 by penetrating the first right cable hole 20Hb.

A lower adhesive member 20Tf may be located between the source COF 11 and the plate 20, and may be coupled or attached to the source COF 11 and the plate 20. An upper adhesive member 20Tsa, 20Tsb may be located between the source PCB 12*a*, 12*b* and the plate 20, and may be coupled or attached to the source PCB 12*a*, 12*b* and the plate 20. For example, the lower adhesive member 20Tf and the upper adhesive member 20Tsa, 20Tsb may be a double-sided tape. Accordingly, the source COF 11 and the source PCB 12*a*, 12*b* may be coupled to the plate 20.

Referring to FIG. 8, the mount plate 40 may include a flat plate portion and a press portion that is formed in the flat plate portion by being pressed. Accordingly, rigidity of the mount plate 40 may be improved.

The electronic component EP may be located in a rear of the mount plate 40, and may be mounted on the mount plate 40. The electronic component EP may include a plurality of boards B1, B2, and B3 and speakers SPKa and SPKb.

A power supply board B1 may be located in a rear of the mount plate 40, and may be coupled to the mount plate 40 through a screw fastening method, or the like. The power supply board B1 may be located in the left side of a central area of the mount plate 40 (see 40B1 in FIG. 6). The power supply board B1 may provide power to each component of the display device.

A timing controller board B2 may be located in a rear of the mount plate 40, and may be coupled to the mount plate 40 through a screw fastening method, or the like. The timing controller board B2 may be located in the central area of the mount plate 40 (see 40B2 in FIG. 6), and may be located above the third cable hole 40H. The timing controller board B2 may be electrically connected to the cable C (see FIG. 11), and may provide an image signal to the display panel 10.

A main board B3 may be located in a rear of the mount plate 40, and may be coupled to the mount plate 40 through a screw fastening method, or the like. The main board B3 may be located in the right side of the central area of the mount plate 40 (see 40B3 in FIG. 6). The main board B3 may control the display device.

The speaker SPKa, SPKb may be located in a rear of the mount plate 40, and may be coupled to the mount plate 40 through a screw fastening method, or the like. The speaker SPKa, SPKb may be adjacent to the lower side of the mount plate 40. The left speaker SPKa may be aligned with the left speaker hole 40*a*, 30*a*, 20*a*, 20Ca (see FIGS. 3 and 4), and the right speaker SPKb may be aligned with the right speaker hole 40*b*, 30*b*, 20*b*, 20Cb (see FIGS. 3 and 4). Accordingly, the speaker SPKa, SPKb may provide sound to the front of the display device through the speaker hole 40*a*, 30*a*, 20*a*, 20Ca, 40*b*, 30*b*, 20*b*, 20Cb.

Referring to FIG. 9, a side cover 52 may have a square bracket shape as a whole. The side cover 52 may include a top part 521, a left part 522, and a right part 523.

The top part 521 may extend in the left-right direction, and may form a long side of the side cover 52. A horizontal portion 521H may form a rear side of the side cover 52. A vertical portion 521V may intersect the horizontal portion 521H, and form an upper side of the side cover 52. A plurality of holes 521*a* may be formed by penetrating the vertical portion 521V in an up-down direction, and may be spaced apart from each other in a left-right direction. The hole 521*a* may be referred to as a heat dissipation hole.

The left part 522 may extend downward from the left distal end of the top part 521, and form a short side of the side cover 52. The horizontal portion 522H may form a rear side of the side cover 52. The vertical portion 522V may form the left side of the side cover 52.

The right part 523 may extend downward from the right end of the top part 521, and form a short side of the side cover 52. The horizontal portion 523H may form a rear side of the side cover 52. The vertical portion 523V may form the right side of the side cover 52.

A rear cover 51 may be located in a rear of the side cover 52. The rear cover 51 may face the mount plate 40 (see FIG. 12) with respect to the side cover 52. The rear cover 51 may include an inner part 511 and an outer part 512.

The inner part 511 may be a part of the rear cover 51 located inside the side cover 52. The size of the inner part 511 may correspond to the size of the mount plate 40 (see FIG. 8). The inner part 511 may cover the rear of the mount plate 40 and the electronic component EP (see FIG. 2). The plurality of holes 511*a* may be formed by penetrating the inner part 511 in the front-rear direction. The hole 511*a* may be referred to as a heat dissipation hole.

The outer part 512 may be a part of the rear cover 51 located outside the side cover 52. The outer part 512 may face the inner part 511 with respect to the top part 521 of the side cover 52. In the up-down direction, the length of the outer part 512 may be smaller than the length of the inner part 511. A pattern 51*g* may be formed on the front side of the outer part 512. For example, the pattern 51*g* may be embossed vertical stripes. For example, the pattern 51*g* may be the same as or similar to the pattern 30*g* (see FIG. 6) formed in the rear side of the second part 30A2 of the frame 30.

The fastening member Fc, such as a screw, may penetrate the horizontal portion 521H, 522H, 523H of the side cover 52 and be fastened to the inner part 511. A plurality of fastening members Fc may be disposed along the inner circumference of the side cover 52. Accordingly, the side cover 52 may be coupled to the rear cover 51.

Meanwhile, a rear coupling portion 51Q may protrude toward the coupling portion 30Q (see FIGS. 5 and 6) from the inside of the inner part 511, and may have a hole communicating with the inside of the coupling portion 30Q. In the front-rear direction, a plurality of rear coupling portions 51Q may be aligned with the plurality of coupling portions 30Q (see FIGS. 5 and 6). A plurality of rear coupling portions 51Q may be disposed along the inner circumference of the side cover 51. The fastening member Fd, such as a screw, may be fastened to the coupling portion 30Q through the rear coupling portion 51Q. Accordingly, the rear cover 51 may be coupled to the frame 30.

Referring to FIG. 10, a slot 51*a*, 51*b*, 51*c* may be formed by penetrating the rear cover 51 in the front-rear direction. For example, the slot 51*a*, 51*b*, 51*c* may be a rectangular opening. A plurality of slots 51*a*, 51*b*, and 51*c* may be spaced apart from each other in the left-right direction. A first slot 51*a* may be adjacent to the upper and right sides of the rear cover 51. A second slot 51*b* may be spaced apart from the first slot 51*a* to the left. A third slot 51*c* may be spaced apart from the second slot 51*b* to the left.

A recessed portion 51*ha* may be formed while being recessed forward from the rear side of the rear cover 51, and may be adjacent to the right side of the rear cover 51. An opening 51*h*1 (see FIG. 9) may be formed by penetrating a lateral side or a lateral wall of the recessed portion 51*ha*. For example, a user may connect a video and/or audio input/output terminal, a USB terminal, or a power input terminal to the input/output units provided in the main board B3 (see FIG. 8) through the opening 51*h*1.

A cover hole 51*h*2 may be formed by penetrating the rear cover 51. The location of the cover hole 51*h*2 may correspond to the location of the power supply board B1 (see FIG. 8).

A plurality of grooves 50*a*, 50*b*, 50*c*, 50*d*, and 50*e* may be formed in the rear side of the rear cover 51. The plurality of grooves 50*a*, 50*b*, 50*c*, 50*d*, and 50*e* may have an elongated ditch shape.

A first groove 50*a* may be located in the center of the rear cover 51, and extend in the up-down direction. An upper end of the first groove 50*a* may be connected to a portion of the rear cover 51 forming a boundary of the third slot 51*c*. A second cut-out 521Vb may be formed in the vertical portion 521V, and may face the first groove 50*a*. A second cut-out 521Vb may communicate with the first groove 50*a*. A first holder 53*a* may be fixed to the rear side of the rear cover 51, and may cover a part of the rear side of the first groove 50*a*.

A second groove 50*b* may extend to the left and right sides from the lower end of the first groove 50*a*. The second groove 50*b* may be adjacent to the lower side of the rear cover 51. A second holder 53*b* may be fixed to the rear side of the rear cover 51, and may cover a part of the rear of the second groove 50*b*.

A third groove 50*c* may extend downward from the left distal end of the second groove 50*b*, and may be formed in a part of the lower side of the rear cover 51. The third groove 50*c* may be adjacent to the left side of the rear cover 51. A third holder 53*c* may be located in the third groove 50*c*, may be fixed to the rear cover 51, and may have a path communicating with the third groove 50*c*.

A fourth groove 50*d* may extend downward from the right distal end of the second groove 50*b*, and may be formed in a part of the lower side of the rear cover 51. The fourth groove 50*d* may be adjacent to the right side of the rear cover 51. The above-described recessed portion 51*ha* may be located between the second groove 50*b* and the fourth groove 50*d*, and may connect the second groove 50*b* and the fourth groove 50*d*. Here, the recessed portion 51*ha* may be adjacent to the right side of the rear cover 51, and may have a puddle shape. A fourth holder 53*d* may be located in the fourth groove 50*d*, may be fixed to the rear cover 51, and may have a path communicating with the fourth groove 50*d*.

A fifth groove 50*e* may extend from an upper end of the recessed portion 51*ha* toward the first slot 51*a*. The upper end of the fifth groove 50*e* may be connected to a portion of the rear cover 51 forming a boundary of the first slot 51*a*. A first cut-out 521Va may be formed in the vertical portion 521V, and may face the fifth groove 50*e*. The first cut-out 521Va may communicate with the fifth groove 50*e*.

A magnetic substance 54 such as iron Fe may be coupled to the rear side of the rear cover 51 through a fastening member Fe such as a screw. A plurality of magnetic substances 54 may be disposed along the circumference of the rear cover 51.

Referring to FIGS. 11 and 12, the end cover 60 may be located in a rear of the back cover 50. The size of the end cover 60 may correspond to the size of the rear cover 51 of the back cover 50. A plurality of holes 611*a* may be formed by penetrating the end cover 60 in the front-rear direction. A hole 611*a* may face the hole 511*a*, and may be referred to as a heat dissipation hole.

A block 61*a*, 61*b*, 61*c* may protrude from the front side of the end cover 60 toward the slot 51*a*, 51*b*, 51*c* (see FIG. 17). The block 61*a*, 61*b*, 61*c* may have a size corresponding to the slot 51*a*, 51*b*, 51*c*. A first block 61*a* may be inserted into the first slot 51*a*, and a pattern 61*g* identical to or similar to the pattern 51*g* may be formed. A second block 61*b* may be inserted into the second slot 51*b*, and the pattern 61*g* identical to or similar to the pattern 51*g* may be formed. A third block 61*c* may be inserted into the third slot 51*c*, and the pattern 61*g* identical to or similar to the pattern 51*g* may be formed.

A magnet 64 may be coupled to the front side of the end cover 60 through a fastening member Ff such as a screw. A plurality of magnets 64 may be disposed along the circumference of the end cover 60. In the front-rear direction, the plurality of magnets 64 may be aligned with the plurality of magnetic substances 54. Accordingly, the end cover 60 may be coupled to the rear cover 51 through magnetic coupling between the magnet 64 and the magnetic substance 54. Meanwhile, in some embodiment, it is also possible that a magnetic substance is provided in the end cover 60 and a magnet is provided in the rear cover 51, or a pair of magnets having magnetic attraction to each other is provided respectively in the rear cover 51 and the end cover 60.

Referring to FIGS. 11 and 13, a guide protrusion 62 may protrude forward from the front side of the end cover 60. For example, a plurality of guide protrusions 62*a* and 62*b* may be provided in the front side of the end cover 60, and may be spaced apart from each other.

In the front-rear direction, the guide protrusion 62 may be aligned with the rear coupling portion 51Q of the rear cover 51. The guide protrusion 62 may be inserted into the rear coupling portion 51Q. Accordingly, the rear coupling portion 51Q may restrict the up-down and left-right movements of the guide protrusion 62 and the end cover 60, that is, the horizontal flow. In addition, the guide protrusion 62 may guide the coupling of the end cover 60 and the rear cover 51.

Referring to FIG. 14, a bending portion 501 of the rear cover 51 may be formed by being bent rearward from the circumference of the rear cover 51, and may form the upper side 51U, the left side 51L (see FIG. 10), and the right side 51R (see FIG. 10). A curved portion 512A1, 512A2 may form the lower portion of the rear cover 51, and may be curved. A second curved portion 512A2 may form a step with respect to a first curved portion 512A1, and may form the lower side 51D of the rear cover 51.

A bending portion 601 of the end cover 60 may be formed by being bent forward from the circumference of the end cover 60, and may form the upper side 60U (see FIG. 11), the left side 60L (see FIG. 11), and the right side 60R (see FIG. 11) of the end cover 60. A curved portion 60A may form the lower portion of the end cover 60, and may be curved.

A jersey 69 may cover the rear of the end cover 60. Alternatively, the jersey 69 may form the rear side of the end cover 60 as one component of the end cover 60. The jersey 69 may wrap around the edge of the end cover 60, and may be attached or fused to the front side of the end cover 60. The jersey 69 may include a fabric material.

Referring to FIGS. 15 and 16, a coupling groove 50GL, 50GR (see FIG. 9) may be formed by being pressed forward from the rear side of the rear cover 51, and may be adjacent to the lower side 51D of the rear cover 51. A first coupling groove 50GL may be adjacent to the left side 51L of the rear cover 51, and a second coupling groove 50GR may be adjacent to the right side 51R of the rear cover 51.

The stand 80 may be adjacent to the lower side 51D of the rear cover 51. The stand 80 may include a pair of stands 80*a* and 80*b* spaced apart from each other in the left-right direction. A first stand 80*a* may be adjacent to the left side 51L of the rear cover 51, and a second stand 80*b* may be adjacent to the right side 51R of the rear cover 51. For example, the first stand 80*a* and the second stand 80*b* may be symmetrical from side to side. The stand 80 of the rear cover 51 may include a leg 81, 82, a body 83, and a neck 84.

The leg 81, 82 may include a first leg 81 and a second leg 82 extending obliquely in different directions from the lower side 51D of the rear cover 51. The first leg 81 extends downward from the lower side 51D and may be inclined forward. The second leg 82 extends downward from the lower side 51D and may be inclined rearward. An angle (theta s) between the first leg 81 and the second leg 82 may be an acute angle.

The body 83 may be located between the lower side 51D of the rear cover 51 and the upper end of the leg 81, 82. The body 83 may connect the first leg 81 and the second leg 82, and support the lower side 51D of the rear cover 51.

The neck 84 may extend from the body 83, and may be inserted into the coupling groove 50GL, 50GR of the rear cover 51. A first neck 84*a* of the first stand 80*a* may extend from the first body 83*a*, and may be inserted into the first coupling groove 50GL. In addition, the center line of the first neck 84*a* may be offset to the right from the leg 81*a*, 82*a* of the first stand 80*a* (see eL in FIG. 15). A second neck 84*b* of the second stand 80*b* may extend from the second body 83*b*, and may be inserted into the second coupling groove 50GR. In addition, the center line of the second neck 84*b* may be offset to the left from the leg 81*b*, 82*b* of the second stand 80*b* (see eR in FIG. 15).

In addition, a neck fixing portion 841, 842 may be formed by being pressed toward the coupling groove 50GL, 50GR from the rear side of the neck 84. For example, the neck fixing portion 841, 842 may include a pair of neck fixing portions 841, 842 spaced apart from each other in the vertical direction. In addition, a neck coupling portion 40*a*1, 40*a*2 may protrude toward the coupling groove 50GL, 50GR from the rear side of the mount plate 40, and may be aligned with the neck fixing portion 841, 842. In this case, the fastening member Fg, such as a screw, may be fastened to the neck coupling portion 40*a*1, 40*a*2 through the neck fixing portion 841, 842.

Accordingly, the stand 80 may be located between the back cover 50 and the end cover 60, and may be coupled to the mount plate 40 through the back cover 50.

Referring to FIG. 17, the body 83 may include a joint 831 and a reinforcing plate 832. The joint 831 may be referred to as a connector or a bridge. The reinforcing plate 832 may include a metal material.

The joint 831 may include a center part 831*a*, a front part 831*b*, a rear part 831*c*, and a bottom part 831*d*. The center part 831*a* may be located between the upper end of the first leg 81 and the upper end of the second leg 82. The front part 831*b* may protrude toward the first leg 81 from the center part 831*a*, and may be inserted into the first leg 81. The fastening member Fk, such as a screw, may be fastened to the first leg 81 through the front part 831*b*. The rear part 831*c* may protrude toward the second leg 82 from the center part 831*a*, and may be located on the second leg 82. The bottom part 831*d* may protrude toward the inside of the second leg 82 from the rear part 831*c*, and may be inserted into the second leg 82. The fastening member Fj, such as a screw, may be fastened to the second leg 82 through the bottom part 831*d*.

Accordingly, the joint 831 may be coupled to the first leg 81 and the second leg 82, and may connect the first leg 81 and the second leg 82.

The lower portion 30Lc of the left side 30L of the frame 30 may be curved along the third part 30A3 (see FIG. 5) of the frame 30, and similarly, the lower portion of the right side of the frame 30 may also be curved. The lower portion 51Lc of the left side 51L of the rear cover 51 may be curved along the second curved portion 512A2 (see FIG. 14) of the rear cover 51, and similarly, the right side 51R of the rear cover 51 may also be curved.

The front cover 20C may include a flat portion 20C1 and a curved portion 20C2. The flat portion 20C1 may be formed flat. The curved portion 20C2 may extend along the lower end of the flat portion 20C1, and may be curved along the lower portion 30Lc of the left side 30L of the frame 30.

At this time, the upper end of the aforementioned first leg 81 may support the curved portion 20C2 of the front cover 20C, and the rear part 831*c* may support the second curved portion 512A2 (see FIG. 14) of the rear cover 51.

The reinforcing plate 832 may include a center plate 832*a*, a front plate 832*b*, a rear plate 832*c*, and a bottom plate 832*d*. The center plate 832*a* may extend along the lower surface of the center part 831*a*, and may be coupled to the lower surface of the center part 831*a* by a fastening member Fh such as a screw. The front plate 832*b* may be bent from the center plate 832*a* toward the lower surface of the front part 831*b*, and may be coupled to the lower surface of the front part 831*b* by the aforementioned fastening member Fk. The rear plate 832*c* may be bent from the center plate 832*a* toward the lower surface of the rear part 831*c*, and may support the lower surface of the rear part 831*c*. The bottom plate 832*d* may be bent toward the front of the bottom part 831*d* from the rear plate 832*c*, and may be coupled to the front side of the bottom part 831*d* by a fastening member Fi such as a screw.

Accordingly, the reinforcing plate 832 may be fixed to the joint 831, and the rigidity of the joint 831 connecting the first leg 81 and the second leg 82 may be improved. The stand can stably support the display device by the reinforcing plate 832, even if the body 83 or the neck 84 is damaged.

Referring to FIGS. 18 and 19, a plurality of cables may be located in a plurality of grooves 50*a*, 50*b*, 50*c*, 50*d*, and 50*e*. A plurality of holders 53*a*, 53*b*, 53*c*, and 53*d* may prevent cables located in the plurality of grooves 50*a*, 50*b*, 50*c*, 50*d*, and 50*e* from being separated.

For example, a first cable C1 may be connected to the power supply board B1 (see FIG. 8) through a hole PCH formed in the cover PCC of the cover hole 51*h*2 (see FIG. 14). The first cable C1 may be located in the second groove 50*b* and the third groove 50*c*, and may be fixed to a first path of the third holder 53*c*. The first cable C1 may be located in a cable groove 82S formed in the rear side of the second leg 82 of the first stand 80*a*. The first cable C1 may be a power cable.

For example, a second cable C2 may be connected to a terminal provided in the right side of the main board B3 (see FIG. 8) through the opening 51*h*1 (see FIG. 12). The second cable C2 may be located in the recessed portion 51*ha* and the fifth groove 50*e*. The second cable C2 may pass between the rear cover 51 and the frame 30 through the first cut-out 521Va (see FIGS. 10 and 13). The second cable C2 may be located in the first groove 50*a*, the second groove 50*b*, and the third groove 50*c* through the second cut-out 521Vb (see FIGS. 10 and 13), and may be fixed to a second path of the third holder 53*c*. The second cable C2 may be located in the cable groove 82S formed in the rear side of the second leg 82 of the first stand 80*a*. The second cable C2 may be an AV cable.

For example, a third cable C3 may be connected to a terminal provided in the lower side of the main board B3 (see FIG. 8) through the opening 51*h*1 (see FIG. 12). The third cable C3 may be located in the recessed portion 51*ha* and the fourth groove 50*d*, and may be fixed to a path provided in the fourth holder 53*d*. The third cable C3 may be located in the cable groove 82S formed in the rear side of the second leg 82 of the second stand 80*b*. The third cable C3 may be an AV cable.

Referring to FIGS. 20 and 21, the cable groove 82S may be formed by being recessed forward from the rear side of the second leg 82, and may extend along the length direction of the second leg 82.

A cable cover 87 may be located between the upper end and the lower end of the second leg 82, and may cover the rear of the cable groove 82S. The cable cover 87 may be detachably coupled to the second leg 82 through, for example, a hook coupling. Accordingly, a cable such as the third cable C3 may be located in the cable groove 82S, and covered by the cable cover 87.

A supporter 85 may be located in the cable groove 82S, and may contact the rear side of the bottom part 831*d* (see FIG. 17) of the joint 831.

An upper holder 86 may be adjacent to the upper end of the second leg 82. The upper holder 86 may include a coupling portion 861 and a channel portion 862. The coupling portion 861 may have a shape corresponding to the outer surface of the second leg 82, and may hold the outer surface of the second leg 82. At this time, the supporter 85 may support the coupling between the second leg 82 and the coupling portion 861. The channel portion 862 may extend rearwardly from coupling portion 861, and may have a "U" shaped cross section.

Accordingly, the upper holder 86 may be detachably coupled to the second leg 82. For example, if the cable groove 82S is full of cables, another cable can pass through the channel 86S of the upper holder 86 defined by the channel portion 862.

A lower holder 88 may be adjacent to the lower end of the second leg 82. The lower holder 88 may include a coupling portion 881 and a channel portion 882. The coupling portion 881 may have a shape corresponding to the outer surface of the second leg 82, and may hold the outer surface of the second leg 82. In this case, the cable cover 87 may support the coupling between the second leg 82 and the coupling portion 881. The channel portion 882 may extend rearwardly from coupling portion 881, and may have a "U" shaped cross section.

Accordingly, the lower holder 88 may be detachably coupled to the second leg 82. For example, if the cable groove 82S is full of cables, another cable can pass through a channel 88S of the lower holder 88 defined by the channel portion 882.

Meanwhile, a foot 89 may be coupled to the lower end of the second leg 82 and the lower end of the first leg 81. The foot 89 is a part that comes into contact with a ground, and may include a rubber or silicon material.

Referring to FIGS. 22 and 23, the basket 90 may include a first basket 901 and a second basket 902.

The first basket 901 may include a first body 901*a* formed flat as a whole, a hooking portion 901*b*, a first coupling portion 901*c*, and a sidewall 901*d*. An opening 991S may be formed in the first body 901*a*. The hooking portion 901*b* may be folded forward from the upper end of the first body

901*a*, and may be spaced apart from the front side of the first body 901*a*. The first coupling portion 901*c* may be curved rearward from the lower end of the first body 901*a*. The sidewall 901*d* may protrude upward from both ends of the first coupling portion 901*c*.

The second basket 902 may include a second body 902*a* formed flat as a whole and a second coupling portion 902*b*. The second body 902*a* may be rearwardly spaced from the first body 901*a* and may face the first body 901*a*. The second coupling portion 902*b* may be curved forward from the lower end of the second body 902*a*, and may be connected to the first coupling portion 901*c*.

The fastening member FI, such as a screw, may be fastened to a fixing portion 902*h* formed in the second coupling portion 902*b* through a hole 901*h* formed in the first coupling portion 901*c*. Accordingly, the first basket 901 may be coupled to the second basket 902, and a space 90S may be formed between the first basket 901 and the second basket 902.

A bracket 99 may be adjacent to an upper end of the first body 901*a*. The bracket 99 may be located between the first body 901*a* and the second body 902*a*. The bracket 99 may include a bracket body 991*a* facing the rear side of the first body 901*a*, a bracket hooking portion 991*b*, a seating portion 991*c*, an adhesive portion 991*d*, and a fixing portion 991*e*. The bracket hooking portion 991*b* may be folded forward from the upper end of the bracket body 991*a*, and may be spaced apart from the front side of the bracket body 991*a*. The seating portion 991*c* may be bent rearward from the lower end of the bracket body 991*a*. The adhesive portion 991*d* may be coupled or attached to the rear side of the bracket body 991*a*. For example, the adhesive portion 991*d* may be a double-sided tape. The fixing portion 991*e* may protrude upward from the upper end of the bracket body 991*a*. The fixing portion 991*e* may have an open ring shape having both ends connected to the bracket body 991*a*, or an open ring (see FIG. 23) shape in which one section is cut.

Accordingly, the bracket 99 may be detachably coupled to the basket 90 by hooking the bracket hooking portion 991*b* to the upper end of the first body 901*a* and the hooking portion 901*b* of the first basket 901. The bracket 99 may be movable along the upper end of the basket 90. In addition, a user may place a device MT such as a power strip or power bar on the seating portion 991*c* and attach it to the adhesive portion 991*d*.

Referring to FIG. 24, a user may put a peripheral device PD such as a set-top box or router, or an object such as a book into the inner space 90S of the basket 90.

For example, the device MT placed on the bracket 99 may provide external power to the peripheral device PD. An input cable Ca may extend from one end of the device MT, and may pass through the fixing portion 991*e*. The input cable Ca may pass the second cut-out 521Vb (see FIGS. 10 and 13) through between the rear cover 51 and the frame 30. The input cable Ca may be located in the first groove 50*a*, the second groove 50*b*, and the third groove 50*c*, and may be located in the cable groove 82S formed in the rear side of the second leg 82 of the first stand 80*a*. The input cable Ca may be electrically connected to an external power source. An output cable Cb may be electrically connected to the device MT and the peripheral device PD, and may provide power to the peripheral device PD.

Referring to FIGS. 25 and 26, when a cable such as the aforementioned input cable Ca is located in the rear side of the rear cover 51, the end cover 60 and the jersey 69 may be coupled to the rear side of the rear cover 51.

The basket 90 may be detachably coupled to the rear cover 51 and the end cover 60 by hooking the hooking portion 901*b* to the upper ends of the rear cover 51 and the end cover 60. The basket 90 may be movable along the upper ends of the rear cover 51 and the end cover 60.

Referring to FIGS. 26 and 27, the rear of the second part 30A2 of the frame 30 may not be covered by the back cover 50. The pattern 30*g* of the second part 30A2 may be exposed in a rearward direction. A thinnest part of the display device 1 may be defined at the position of the second part 30A2.

The pattern 51*g* (see FIG. 13) of the back cover 50 and the pattern 61*g* (see FIG. 13) of the block 61*a*, 61*b*, 61*c* may be exposed through between the second part 30A2 of the frame 30 and the outer part 512 of the back cover 50.

The jersey 69 and the side cover 52 may have the same or a different color. In addition, the front cover 20C (see FIG. 1) may have the same color as or a different color from the side cover 52.

The third part 30A3 of the frame 30 and the second curved portion 512A2 of the rear cover 51 may have a certain curvature Rd.

The display panel 10 may be spaced upward from the ground by the stand 80.

Referring to FIGS. 20 and 28, an input unit AU may be located at the lower end of the front cover 20C, and may be coupled to the mount plate 40 (see FIG. 2). As described above, the front cover 20C may have a certain curvature, and the front of the input unit AU may not be covered by the front cover 20C. For example, the input unit AU may be an antenna unit or a light receiving device capable of receiving an IR signal from a remote controller.

A repeater RT may be coupled to or attached to the seating portion 51S formed in the lower side 51D of the rear cover 51. The seating portion 51S may be parallel to the XZ plane of the ground. For example, the repeater RT may be attached to the seating portion 51S through a double-sided tape. The repeater RT may be electrically connected to a peripheral device PD such as a set-top box housed in the basket 90. Accordingly, the repeater RT may transfer a signal (e.g. an IR signal) of the front of the display device to the peripheral device PD.

Referring to FIGS. 1 to 28, a display device according to an aspect of the present disclosure may include: a display panel; a frame which is located in a rear of the display panel, and to which the display panel is coupled; a back cover which covers a rear of the frame, and which is coupled to the frame; and a basket which is located in a rear of the back cover, and which has an inner space, wherein an upper side of the back cover may be spaced apart from an upper side of the frame in a rearward direction, and the basket may span the upper side of the back cover.

The basket may include: a first body facing a rear side of the back cover; a second body opposite to the first body; and a hooking portion folded forward from an upper end of the first body, wherein the hooking portion may span the upper side of the back cover, and the inner space of the basket may be formed between the first body and the second body.

The display device may further include a bracket which is located between the first body and the second body, and which has a seating portion intersecting the first body, and the bracket may span an upper side of the basket.

The basket may be movable along the upper side of the back cover, and the bracket may be movable along the upper side of the basket.

The basket may include: a bracket body facing a rear side of the first body; a bracket hooking portion folded forward from an upper end of the bracket body; and an adhesive portion coupled to a rear side of the bracket body, wherein the bracket hooking portion may span the upper side of the basket and the hooking portion, and the seating portion may be bent rearward from a lower end of the bracket body.

The bracket may further include a fixing portion having both ends connected to the bracket body, the fixing portion having an open ring shape or an open ring shape in which one section is cut off.

The back cover may include: a groove formed in a rear side of the back cover; and a holder which is fixed to the rear side of the back cover, and which covers a portion of a rear of the groove.

The back cover may includes: a rear cover which is opposite to the frame, and which has the groove; and a side cover which is located between the frame and the rear cover, and which forms a lateral side of the back cover, and the basket may span an upper side of the rear cover.

The upper side of the rear cover may be located between an upper side of the side cover and the upper side of the frame, and the side cover may further include a cut-out which is formed in the upper surface of the side cover, and which is opposite to the groove.

The display device may further include an end cover which is located between the back cover and the basket, and which covers a rear of the back cover, the rear cover may include a slot which is located above the cut-out, and which is formed by penetrating the rear cover in a thickness direction, and the end cover may include a block which protrudes from a front side of the end cover toward the slot, and which is inserted into the slot.

The display device may further include a mount plate which is located between the frame and the back cover, and which is coupled to the frame and the back cover; and a PCB which is located between the mount plate and the back cover, and which is mounted on the mount plate, the back cover includes a recessed portion which is formed by being pressed forward from a rear side of the back cover, and which has an opening facing one side of the PCB, and the groove may include a plurality of grooves connected to the recessed portion.

The display device may further include a stand adjacent to a lower side of the back cover, the stand may include: a neck coupled to a rear side of the back cover; a body which is connected to the neck, and which supports the lower side of the back cover; and a leg extending downwardly from the body, and the leg may include a cable groove which is formed in a rear side of the leg, and which extends in a length direction of the leg.

The stand may further include a cable cover which is located between an upper end and a lower end of the leg, and which covers a rear of the cable groove, and the cable cover may be detachably coupled to the leg.

The stand may further include: an upper holder adjacent to an upper end of the leg; and a lower holder adjacent to a lower end of the leg, wherein each of the upper holder and the lower holder may include: a coupling portion which has a shape corresponding to an outer surface of the leg, and which is coupled to the outer surface; and a channel portion which extends in a rearward direction from the coupling portion, and which has a U-shaped cross section.

The leg may include: a first leg which extends downward from the body and which is inclined in a forward direction; and a second leg inclined at a certain angle with respect to the first leg, and which has the cable groove, and the body includes: a joint connecting the first leg and the second leg; and a reinforcing plate which extends along a lower side of the joint, and which is coupled to the lower side of the joint, the reinforcing plate having one end coupled to the first leg and the joint, and the other end coupled to the second leg and the joint.

Any or other embodiments of the present disclosure described above are not mutually exclusive or distinct. Any or other embodiments of the present disclosure described above may be used jointly or combined in each configuration or function.

For example, it means that configuration A described in a specific embodiment and/or drawings may be combined with configuration B described in other embodiments and/or drawings. That is, even if the coupling between the components is not directly described, it means that the coupling is possible except for the case where it is described that the coupling is impossible.

The above detailed description should not be construed as restrictive in all respects and should be considered as illustrative. The scope of the present disclosure should be determined by a reasonable interpretation of the appended claims, and all modifications within the equivalent scope of the present disclosure are included in the scope of the present disclosure.

The invention claimed is:

1. A display device comprising:
a display panel;
a frame which is located in a rear of the display panel, and to which the display panel is coupled;
a back cover which covers a rear of the frame, and which is coupled to the frame; and
a basket which is located in a rear of the back cover, and which has an inner space,
wherein an upper side of the back cover is spaced apart from an upper side of the frame in a rearward direction,
wherein the basket spans the upper side of the back cover,
wherein the basket comprises:
a first body facing a rear side of the back cover;
a second body opposite to the first body; and
a hooking portion folded forward from an upper end of the first body,
wherein the hooking portion spans the upper side of the back cover, and
wherein the inner space of the basket is formed between the first body and the second body,
wherein a bracket is located between the first body and the second body, and has a seating portion intersecting the first body, and
wherein the bracket spans an upper side of the basket.

2. The display device of claim 1, wherein the basket is movable along the upper side of the back cover, and
wherein the bracket is movable along the upper side of the basket.

3. The display device of claim 1, wherein the bracket comprises:
a bracket body facing a rear side of the first body;
a bracket hooking portion folded forward from an upper end of the bracket body; and
an adhesive portion coupled to a rear side of the bracket body,
wherein the bracket hooking portion spans the upper side of the basket and the hooking portion,
wherein the seating portion is bent rearward from a lower end of the bracket body.

4. The display device of claim 3, wherein the bracket further comprises a fixing portion having both ends connected to the bracket body, the fixing portion having an open ring shape or an open ring shape in which one section is cut off.

5. The display device of claim 1, wherein the back cover comprises:
a groove formed in a rear side of the back cover; and
a holder which is fixed to the rear side of the back cover, and which covers a portion of a rear of the groove.

6. The display device of claim 5, further comprising:
a mount plate which is located between the frame and the back cover, and which is coupled to the frame and the back cover; and
a PCB which is located between the mount plate and the back cover, and which is mounted on the mount plate,
wherein the back cover comprises a recessed portion which is formed by being pressed forward from a rear side of the back cover, and which has an opening facing one side of the PCB, and
wherein the groove comprises a plurality of grooves connected to the recessed portion.

7. The display device of claim 5, further comprising a stand adjacent to a lower side of the back cover,
wherein the stand comprises:
a neck coupled to a rear side of the back cover;
a body which is connected to the neck, and which supports the lower side of the back cover; and
a leg extending downwardly from the body,
wherein the leg comprises a cable groove which is formed in a rear side of the leg, and which extends in a length direction of the leg.

8. The display device of claim 7, wherein the leg comprises:
a first leg which extends downward from the body and which is inclined in a forward direction; and
a second leg inclined at a certain angle with respect to the first leg, and which has the cable groove,
wherein the body comprises:
a joint connecting the first leg and the second leg; and
a reinforcing plate which extends along a lower side of the joint, and which is coupled to the lower side of the joint, the reinforcing plate having one end coupled to the first leg and the joint, and the other end coupled to the second leg and the joint.

9. A display device comprising:
a display panel;
a frame which is located in a rear of the display panel, and to which the display panel is coupled;
a back cover which covers a rear of the frame, and which is coupled to the frame; and
a basket which is located in a rear of the back cover, and which has an inner space,
wherein an upper side of the back cover is spaced apart from an upper side of the frame in a rearward direction,
wherein the basket spans the upper side of the back cover
wherein the back cover comprises:
a groove formed in a rear side of the back cover;
a holder which is fixed to the rear side of the back cover, and which covers a portion of a rear of the groove;
a rear cover which is opposite to the frame, and which has the groove; and
a side cover which is located between the frame and the rear cover, and which forms a lateral side of the back cover,
wherein the basket spans an upper side of the rear cover.

10. The display device of claim 9, wherein the upper side of the rear cover is located between an upper side of the side cover and the upper side of the frame, and
wherein the side cover further comprises a cut-out which is formed in the upper side of the side cover, and which is opposite to the groove.

11. The display device of claim 10, further comprising an end cover which is located between the back cover and the basket, and which covers a rear of the back cover, wherein the rear cover comprises a slot which is located above the cut-out, and which is formed by penetrating the rear cover in a thickness direction, and wherein the end cover comprises a block which protrudes from a front side of the end cover toward the slot, and which is inserted into the slot.

12. The display device of claim 9, wherein the basket comprises:

a first body facing a rear side of the back cover;

a second body opposite to the first body; and a hooking portion folded forward from an upper end of the first body, wherein the hooking portion spans the upper side of the back cover, and wherein the inner space of the basket is formed between the first body and the second body.

13. The display device of claim 9, further comprising a stand adjacent to a lower side of the back cover, wherein the stand comprises:

a neck coupled to a rear side of the back cover;

a body which is connected to the neck, and which supports the lower side of the back cover; and a leg extending downwardly from the body.

14. The display device of claim 13, wherein the leg comprises a cable groove which is formed in a rear side of the leg, and which extends in a length direction of the leg.

15. The display device of claim 9, wherein the bracket comprises:

a bracket body facing a rear side of the first body;

a bracket hooking portion folded forward from an upper end of the bracket body; and an adhesive portion coupled to a rear side of the bracket body, wherein the bracket hooking portion spans the upper side of the basket and the hooking portion, and wherein the seating portion is bent rearward from a lower end of the bracket body.

16. The display device of claim 15, wherein the bracket further comprises a fixing portion having both ends connected to the bracket body, the fixing portion having an open ring shape or an open ring shape in which one section is cut off.

17. A display device comprising:

a display panel;

a frame which is located in a rear of the display panel, and to which the display panel is coupled;

a back cover which covers a rear of the frame, and which is coupled to the frame; and a basket which is located in a rear of the back cover, and which has an inner space, wherein an upper side of the back cover is spaced apart from an upper side of the frame in a rearward direction, wherein the basket spans the upper side of the back cover, wherein the back cover comprises:

a groove formed in a rear side of the back cover; and a holder which is fixed to the rear side of the back cover, and which covers a portion of a rear of the groove a stand adjacent to a lower side of the back cover, wherein the stand comprises:

a neck coupled to a rear side of the back cover;

a body which is connected to the neck, and which supports the lower side of the back cover; and a leg extending downwardly from the body, wherein the leg comprises a cable groove which is formed in a rear side of the leg, and which extends in a length direction of the leg, a cable cover which is located between an upper end and a lower end of the leg, and which covers a rear of the cable groove, and wherein the cable cover is detachably coupled to the leg.

18. The display device of claim 17, wherein the stand further comprises:

an upper holder adjacent to an upper end of the leg; and a lower holder adjacent to a lower end of the leg, wherein each of the upper holder and the lower holder comprises:

a coupling portion which has a shape corresponding to an outer surface of the leg, and which is coupled to the outer surface; and a channel portion which extends in a rearward direction from the coupling portion, and which has a U-shaped cross section.

19. The display device of claim 17, wherein the basket comprises:

a first body facing a rear side of the back cover;

a second body opposite to the first body; and a hooking portion folded forward from an upper end of the first body, wherein the hooking portion spans the upper side of the back cover, and wherein the inner space of the basket is formed between the first body and the second body.

20. The display device of claim 17, wherein the bracket comprises:

a bracket body facing a rear side of the first body;

a bracket hooking portion folded forward from an upper end of the bracket body; and an adhesive portion coupled to a rear side of the bracket body, wherein the bracket hooking portion spans the upper side of the basket and the hooking portion, and wherein the seating portion is bent rearward from a lower end of the bracket body.

* * * * *